US012628537B2

(12) United States Patent
Lee et al.

(10) Patent No.: US 12,628,537 B2
(45) Date of Patent: May 12, 2026

(54) DISPLAY PANEL AND DISPLAY DEVICE WITH LIGHT-EMITTING ELEMENTS AND LIGHT-BLOCKING PATTERNS

(71) Applicant: Samsung Display Co., Ltd., Yongin-si (KR)

(72) Inventors: Hyeonbum Lee, Hwaseong-si (KR); Beohmrock Choi, Seoul (KR); Chiwook An, Hwaseong-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 842 days.

(21) Appl. No.: 17/876,407

(22) Filed: Jul. 28, 2022

(65) Prior Publication Data

US 2023/0111574 A1     Apr. 13, 2023

(30) Foreign Application Priority Data

Oct. 8, 2021     (KR) ........................ 10-2021-0134304

(51) Int. Cl.
   *H10K 59/80*        (2023.01)
   *G06F 3/044*        (2006.01)
   (Continued)

(52) U.S. Cl.
   CPC ....... *H10K 59/8792* (2023.02); *G06F 3/0446* (2019.05); *H10K 59/122* (2023.02);
   (Continued)

(58) Field of Classification Search
   CPC .............. H10K 59/353; H10K 59/352; H10K 59/8792; H10K 59/122; H10K 59/40;
   (Continued)

(56) References Cited

U.S. PATENT DOCUMENTS

| | | | |
|---|---|---|---|
| 9,696,835 B2 | 7/2017 | Her | |
| 11,042,237 B2 | 6/2021 | Lee et al. | |

(Continued)

FOREIGN PATENT DOCUMENTS

| | | |
|---|---|---|
| KR | 20150020929 A | 2/2015 |
| KR | 10-2020-0081911 | 7/2020 |

(Continued)

*Primary Examiner* — Wael M Fahmy
*Assistant Examiner* — Tiberiu Dan Onuta
(74) *Attorney, Agent, or Firm* — Harness, Dickey & Pierce, P.L.C.

(57)        ABSTRACT

A display device includes a display panel including first and second areas each including a plurality of element areas and a peripheral area, a first light blocking pattern disposed on the display panel and overlapping the second area, and a second light blocking pattern disposed on the display panel, overlapping the second area, and disposed farther away from the display panel than the first light blocking pattern. Each of first, second and third element areas of the second area includes a plurality of light emitting areas and a non-light-emitting area disposed between the light emitting areas, the first light blocking pattern overlaps the non-light-emitting area of the second element area, and the second light blocking pattern overlaps the non-light-emitting area of the first element area and the non-light-emitting area of the third element area.

26 Claims, 18 Drawing Sheets

(51) Int. Cl.

| | | |
|---|---|---|
| *H10K 59/122* | (2023.01) | |
| *H10K 59/35* | (2023.01) | |
| *H10K 59/40* | (2023.01) | |

(52) U.S. Cl.
CPC ......... *H10K 59/352* (2023.02); *H10K 59/353*
(2023.02); *H10K 59/40* (2023.02); *G06F*
*2203/04112* (2013.01)

(58) Field of Classification Search
CPC ...... H10K 59/30; H10K 50/865; H10K 50/86;
H10K 30/87; G06F 3/0446; G06F
2203/04112; G09G 3/3225
See application file for complete search history.

(56) References Cited

U.S. PATENT DOCUMENTS

| | | | |
|---|---|---|---|
| 11,706,957 | B2 | 7/2023 | Kim et al. |
| 11,778,884 | B2 | 10/2023 | Lee et al. |

| | | | | |
|---|---|---|---|---|
| 2016/0276421 | A1* | 9/2016 | Lee | .................... H10K 59/38 |
| 2021/0005669 | A1 | 1/2021 | Kamada et al. | |
| 2021/0118855 | A1* | 4/2021 | Kusunoki | .......... H10H 20/8513 |
| 2022/0209203 | A1* | 6/2022 | Kim | .................... H10K 59/873 |
| 2022/0261584 | A1* | 8/2022 | Heo | .................... H10K 50/15 |
| 2022/0406855 | A1* | 12/2022 | Park | .................... H10K 59/38 |
| 2024/0107852 | A1* | 3/2024 | Lee | .................... H10K 71/50 |

FOREIGN PATENT DOCUMENTS

| | | | | |
|---|---|---|---|---|
| KR | 10-2020-0108148 | | 9/2020 | |
| KR | 20200176664 | * | 12/2020 | ............ H10K 99/00 |
| KR | 20200188156 | * | 12/2020 | ............ H01L 27/32 |
| KR | 10-2021-0004867 | | 1/2021 | |
| KR | 10-2021-0017493 | | 2/2021 | |
| KR | 20210052656 A | | 5/2021 | |
| KR | 20210109716 A | | 9/2021 | |

* cited by examiner

DISPLAY PANEL AND DISPLAY DEVICE WITH LIGHT-EMITTING ELEMENTS AND LIGHT-BLOCKING PATTERNS

CROSS REFERENCE TO RELATED APPLICATION

This application claims priority from and the benefit of Korean Patent Application No. 10-2021-0134304, filed on Oct. 8, 2021, which is hereby incorporated by reference for all purposes as if fully set forth herein.

BACKGROUND

Field

Embodiments of the invention relate generally to a display device and more specifically, to a display device having various operating modes.

Discussion of the Background

Electronic devices, such as smartphones, tablet computers, notebook computers, car navigation units, smart televisions, etc., have been developed. The electronic devices include a display device to provide information to users.

The users have demanded the high quality of images that fits the usage situation of the display device. The users have demanded a brighter image at outdoors where natural light affects the quality of the images displayed by the display device. When personal information is displayed on the display device, the users have requested an image displayed with a narrow viewing angle.

The above information disclosed in this Background section is only for understanding of the background of the inventive concepts, and, therefore, it may contain information that does not constitute prior art.

SUMMARY

Applicant discovered that when a display device is operated in a private mode (e.g., a narrow viewing mode), the image quality of the display device is degraded due to, e.g., a color shift phenomenon.

Display devices constructed according to the principles of the invention are capable of preventing the image degradation when the display devices are operated in the narrow viewing mode by providing light blocking layers having specific patterns. Further, the display devices are capable of providing a display panel with a constant color purity at a specific viewing angle.

According to the above, the light blocking layer adjacent to a relatively small element area is disposed closer to the display panel than the light blocking layer adjacent to a relatively larger element area. Thus, the display device including the private mode, in which the color shift phenomenon is reduced, is provided.

Additional features of the inventive concepts will be set forth in the description which follows, and in part will be apparent from the description, or may be learned by practice of the inventive concepts.

According to an aspect of the invention, a display device includes a display panel including a first area and a second area, the first area including a first-first element area for emitting a first color light, a first-second element area for emitting a second color light, a first-third element area for emitting a third color light, and a first peripheral area, the second area including a second-first element area for emitting the first color light, a second-second element area for emitting the second color light, a second-third element area for emitting the third color light, and a second peripheral area, the second-second element area having a size smaller than a size of the second-first element area and a size of the second-third element area; a first light blocking pattern disposed on the display panel, the first light blocking pattern not overlapping the first area and overlapping the second-second element area of the second area; and a second light blocking pattern disposed on the display panel, the second light blocking pattern not overlapping the first area and overlapping the second-first element area and the second-third element area of the second area, wherein: each of the second-first element area, the second-second element area, and the second-third element area of the second area comprises a plurality of light emitting areas and a non-light-emitting area disposed between the plurality of light emitting areas, the first light blocking pattern overlaps the non-light-emitting area of the second-second element area of the second area, and the second light blocking pattern overlaps the non-light-emitting area of the second-first element area of the second area and the non-light-emitting area of the second-third element area of the second area, and wherein the first light blocking pattern and the second light blocking pattern are disposed on different layers.

The second light blocking pattern may be disposed farther away from the display panel than the first light blocking pattern.

The display device may further include an input sensor disposed on the display panel and including sensing electrodes overlapping the first peripheral area or the second peripheral area and at least one sensing insulating layer and a first cover layer disposed on an upper sensing insulating layer at an uppermost position of the at least one sensing insulating layer. The second light blocking pattern may be disposed on the first cover layer.

The first light blocking pattern may be disposed on the upper sensing insulating layer and covered by the first cover layer.

The display device may further include an additional cover layer disposed between the upper sensing insulating layer and the first cover layer to cover the sensing electrodes, and the first light blocking pattern is in contact with the sensing electrodes and covered by the additional cover layer.

The display device may further include a second cover layer disposed on the first cover layer and covering the second light blocking pattern, and the first cover layer and the second cover layer may include an organic material.

The first cover layer may have a thickness greater than a thickness of the second cover layer.

The display device may further include an input sensor disposed on the display panel and including sensing electrodes overlapping the first peripheral area or the second peripheral area and at least one sensing insulating layer, and the first light blocking pattern may be provided integrally with the sensing electrodes.

The first light blocking pattern may have a first line width greater than a line width of the sensing electrodes.

The sensing electrodes may overlap the non-light-emitting area of each of the second-first element area and the second-third element area of the second area.

The sensing electrodes overlapping the second light blocking pattern and the non-light-emitting area of each of the second-first element area and the second-third element area among the sensing electrodes may have a second line width smaller than the first line width.

The sensing electrodes overlapping the first area among the sensing electrodes may have a third line width smaller than the second line width.

The display panel may further include: first light emitting elements disposed in each of the first-first element area of the first area and the second-first element area of the second area, second light emitting elements disposed in each of the first-second element area of the first area and the second-second element area of the second area, and third light emitting elements disposed in each of the first-third element area of the first area and the second-third element area of the second area, wherein the first light emitting elements, the second light emitting elements, and the third light emitting elements may be for respectively providing lights having different colors, wherein each of the first light emitting elements, the second light emitting elements, and the third light emitting elements may include a first electrode, a second electrode, and a light emitting layer disposed between the first electrode and the second electrode, and wherein the display panel may further include a first pixel definition layer having openings defined therethrough to expose at least a portion of the first electrode of each of the first light emitting elements, the second light emitting elements, and the third light emitting elements.

The display panel may include a second pixel definition layer disposed on the first electrodes exposed through the openings of the first pixel definition layer and overlapping the non-light-emitting areas of the second area.

The display panel may further include an additional pixel definition layer disposed on the first electrodes exposed through the openings in the first area, and each of the first-first element area, the first-second element area, and the first-third element area of the first area comprises a plurality of light emitting areas separated from each other by the additional pixel definition layer.

The number of the plurality of light emitting areas of each of the second-first element area, the second-second element area, and the second-third element area of the second area may be equal to the number of the plurality of light emitting areas of each of the first-first element area, the first-second element area, and the first-third element area of the first area.

Each of the light emitting areas included in the third element area of the second area has a size smaller than a size of each of the light emitting areas included in the first element area of the second area and greater than a size of each of the light emitting areas included in the second element area of the second area.

The display panel may be to activate the first light emitting element, the second light emitting element, and the third light emitting element in the first area and the first light emitting element, the second light emitting element, and the third light emitting element in the second area in a first operation mode, and the display panel may be to deactivate the first light emitting element, the second light emitting element, and the third light emitting element in the first area and to activate the first light emitting element, the second light emitting element, and the third light emitting element in the second area in a second operation mode.

The plurality of light emitting areas respectively included in the first element area, the second element area, and the third element area of the second area may have a same size as each other.

The number of the light emitting areas in the second-second element area of the second area is smaller than the number of the light emitting areas in the second-first element area of the second area or the number of the light emitting areas in the second-third element area of the second area.

The display device may further include an anti-reflective layer disposed on the second light blocking pattern.

The display device may further include a first additional light blocking pattern overlapping the second peripheral area adjacent to the second-second element area of the second area and provided integrally with the first light blocking pattern.

The display device may further include a second additional light blocking pattern overlapping the second peripheral area disposed between the second-first element area and the second-third element area of the second area and provided integrally with the second light blocking pattern.

According to another aspect of the invention, a display device includes: a display panel operating in a first mode and a second mode and comprising a first area and a second area, the first area including a first-first light emitting area for emitting a first color light, a first-second light emitting area for emitting a second color light, a first-third light emitting area for emitting a third color light, a first-fourth light emitting area for emitting the second color light, and a first peripheral area, the second area including a plurality of second-first light emitting areas for emitting the first color light, a plurality of second-second light emitting areas for emitting the second color light, a plurality of second-third light emitting areas for emitting the third color light, a plurality of second-fourth light emitting areas for emitting the second color light, and a second peripheral area; a first light blocking pattern disposed on the second peripheral area of the second area of the display panel, the first light blocking pattern surrounding and exposing the plurality of second-second light emitting areas and the plurality of second-fourth light emitting areas when viewed in plan; and a second light blocking pattern disposed on the second peripheral area of the second area of the display panel, the second light blocking pattern surrounding and exposing the plurality of second-first light emitting areas and the plurality of second-third light emitting areas of the second area when viewed in plan, wherein the first light blocking pattern and the second light blocking pattern are disposed on different layers.

The first mode may be a wide viewing mode, and the second mode may be a narrow viewing mode.

The second light blocking pattern may be disposed at a higher level than the first light blocking pattern.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
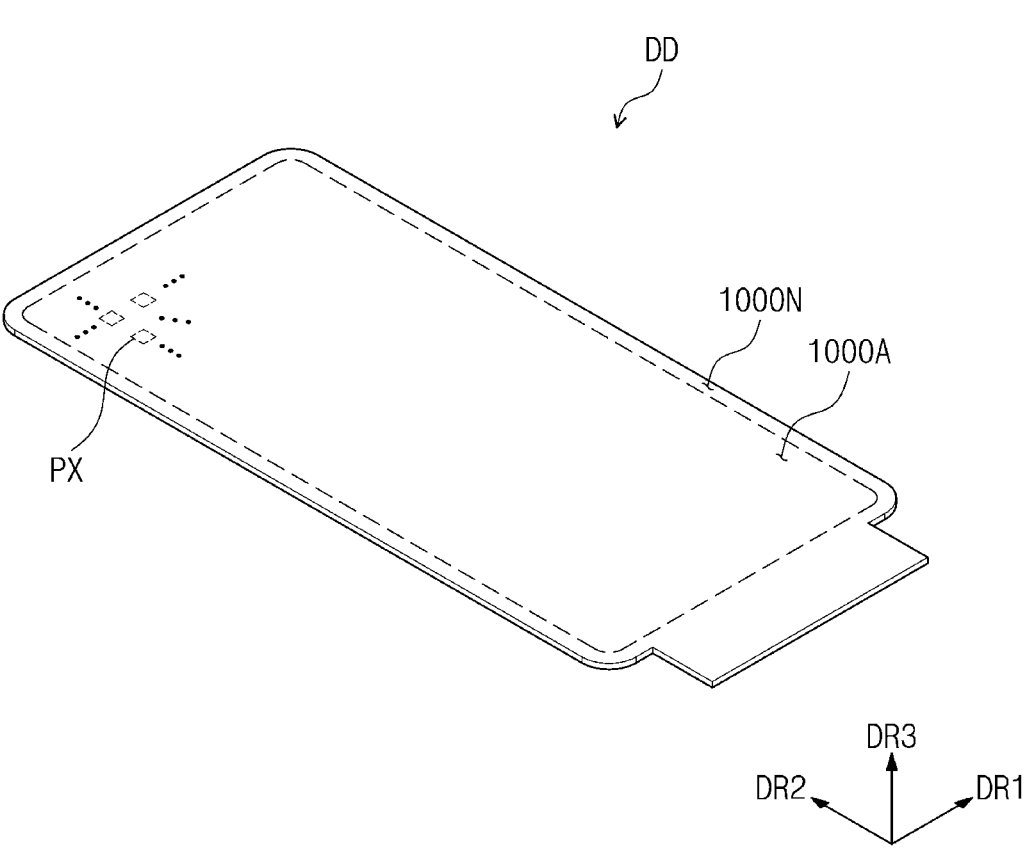
FIG. 1 is a perspective view of an embodiment of a display device according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described with reference to accompanying drawings.

Figure 2:
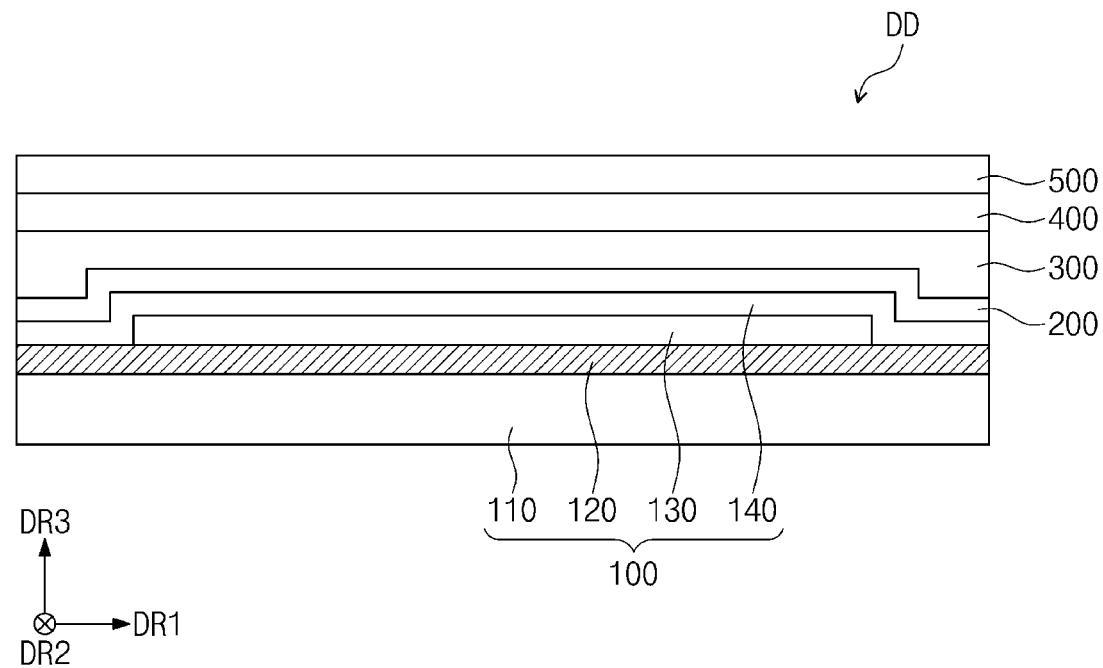
FIG. 2 is a cross-sectional view of the display device of FIG. 1.
Figure 3:
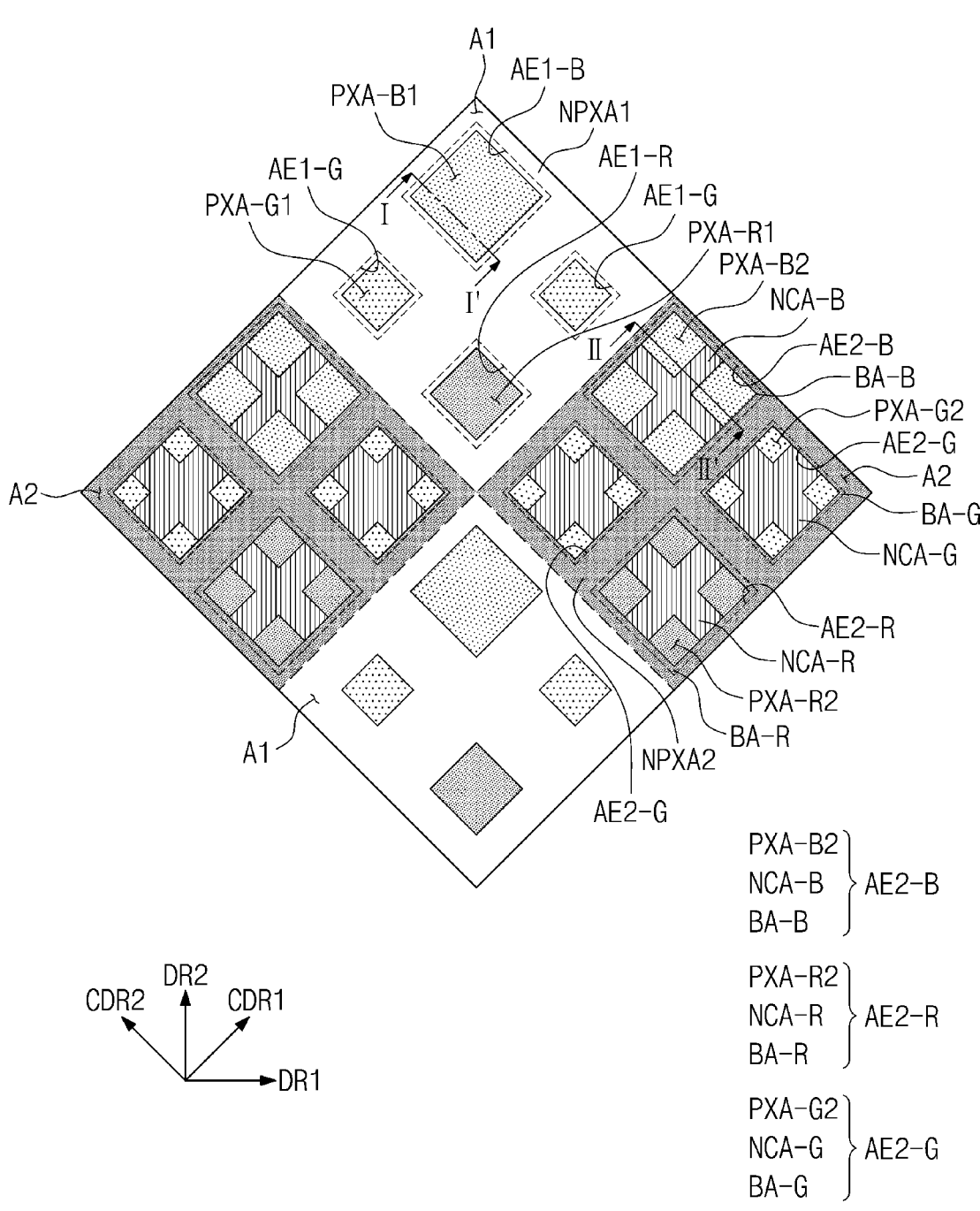
FIG. 3 is a plan view of a display panel of the display device of FIG. 1.
Figure 4A:
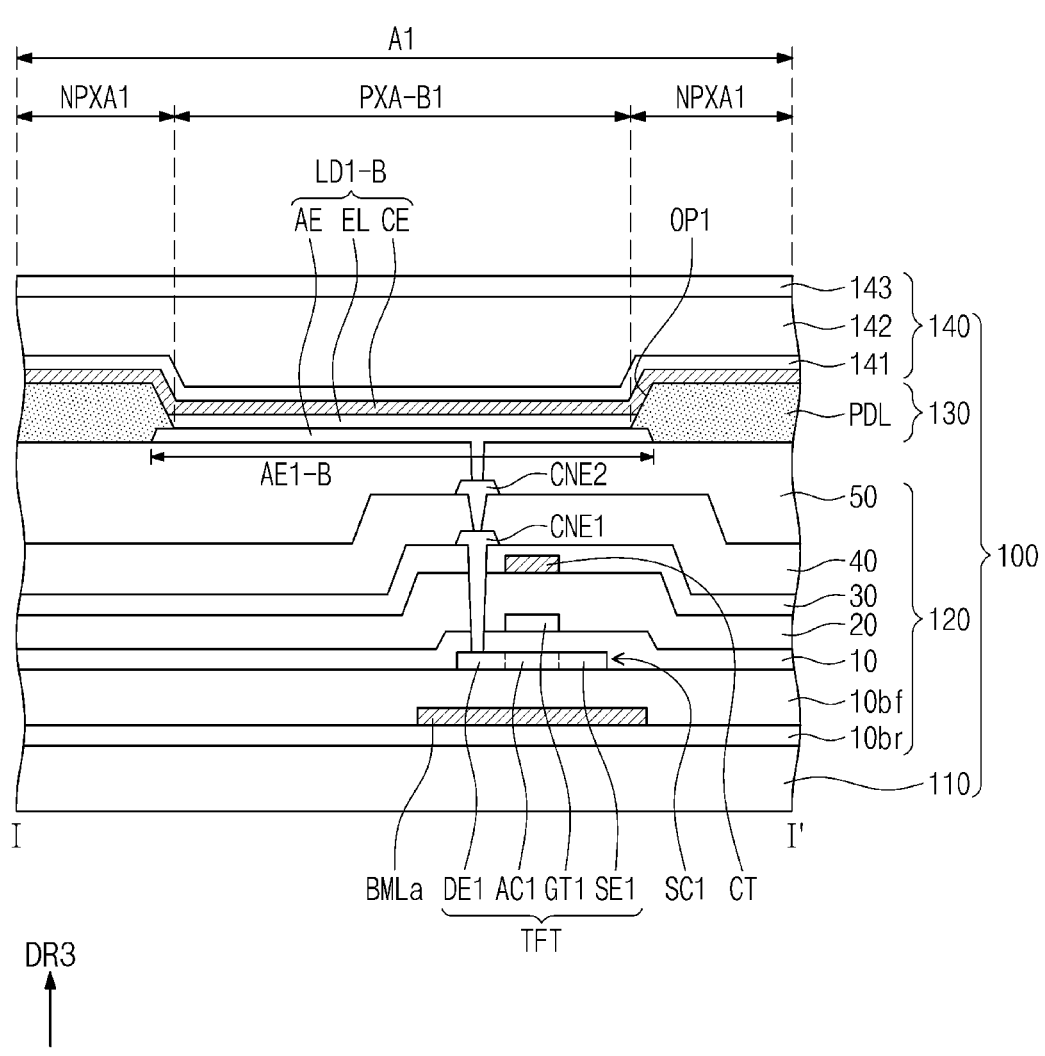
FIG. 4A is a cross-sectional view taken along a line I-I' of FIG. 3.
Figure 4B:
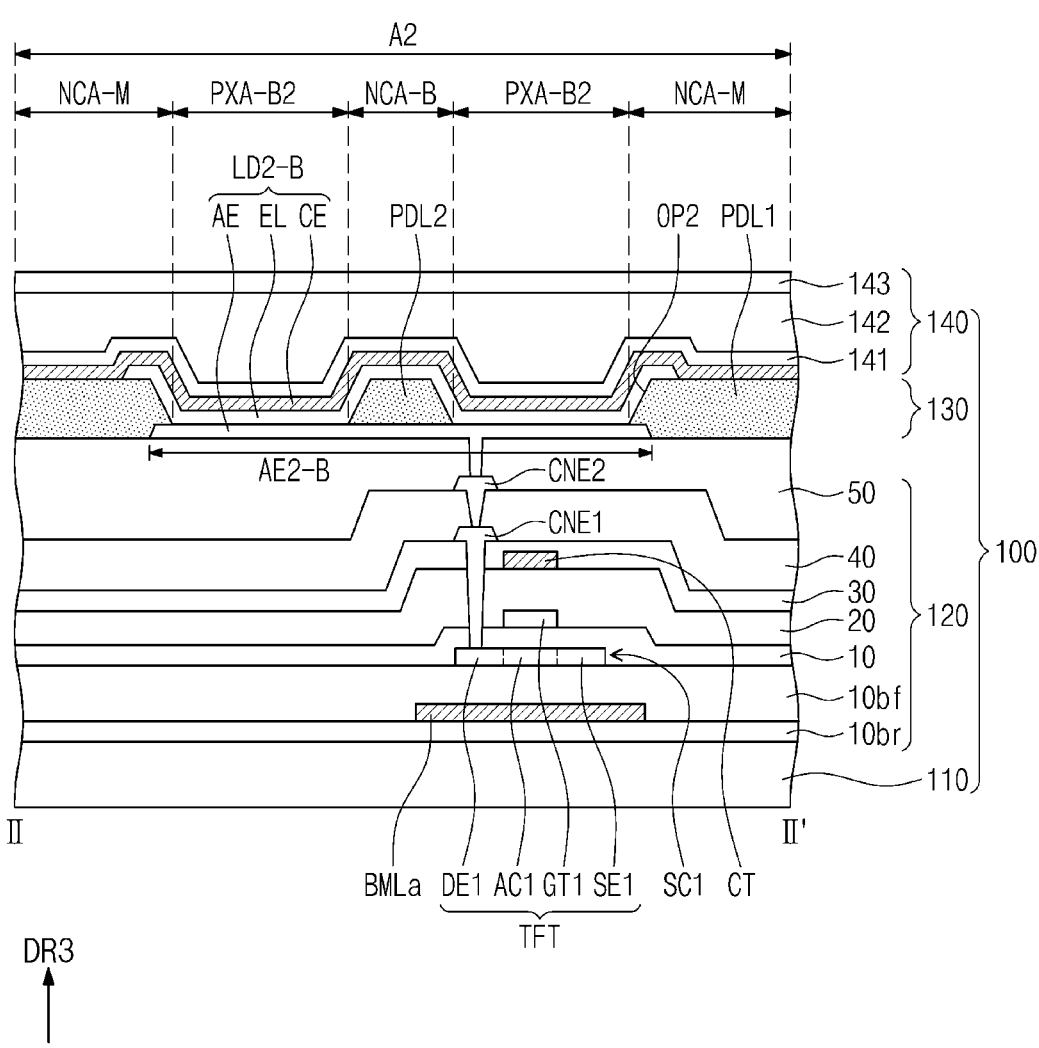
FIG. 4B is a cross-sectional view taken along a line II-II' of FIG. 3.

FIG. 1 is a perspective view of a display device DD according to an embodiment. FIG. 2 is a cross-sectional view of the display device DD according to an embodiment. FIG. 3 is a plan view of a portion of a display panel according to an embodiment. FIG. 4A is a cross-sectional view taken along a line I-I' of FIG. 3. FIG. 4B is a cross-sectional view taken along a line II-II' of FIG. 3.

FIG. 1 is a perspective view of the display device DD according to an embodiment.

The display device DD may generate an image and may sense an external input. The display device DD may include a display area 1000A and a non-display area 1000N. A pixel PX may be disposed in the display area 1000A. The pixel PX may include a first color pixel, a second color pixel, and a third color pixel, which generate lights having different colors.

An image may be displayed in the display area 1000A. The display area 1000A may include a plane defined by a first direction DR1 and a second direction DR2. The display area 1000A may further include curved surfaces bent from at least two sides of the plane. However, the shape of the display area 1000A should not be limited thereto or thereby. As an example, the display area 1000A may include a flat surface. For example, the display area 1000A may further include two or more curved surfaces, e.g., four curved surfaces respectively bent from four sides of the flat surface.

FIG. 2 is a cross-sectional view of the display device DD according to an embodiment. Referring to FIG. 2, the display device DD may include a display panel 100, an input sensor 200, a light control layer 300, an anti-reflective layer 400, and a window 500.

The display panel 100 may be a light emitting type display panel. For example, the display panel 100 may be an organic light emitting display panel, an inorganic light emitting display panel, a micro-LED display panel, a nano-LED display panel, or a quantum dot display panel. The display panel 100 may include a base layer 110, a circuit layer 120, a light emitting element layer 130, and an encapsulation layer 140.

The base layer 110 may provide a base surface on which the circuit layer 120 is disposed. The base layer 110 may be a rigid substrate or a flexible substrate that is bendable, foldable, or rollable. The base layer 110 may be a glass substrate, a metal substrate, or a polymer substrate, however, embodiments are not limited thereto or thereby. According to an embodiment, the base layer 110 may be an inorganic layer, an organic layer, or a composite material layer.

The base layer 110 may have a multi-layer structure. For instance, the base layer 110 may include a first synthetic resin layer, an inorganic layer having a single-layer structure or a multi-layer structure, and a second synthetic resin layer disposed on the inorganic layer having the single-layer structure or a multi-layer structure. Each of the first and second synthetic resin layers may include a polyimide-based resin, however, embodiments are not limited thereto.

The circuit layer 120 may be disposed on the base layer 110. The circuit layer 120 may include an insulating layer, a semiconductor pattern, a conductive pattern, and a signal line. The circuit layer 120 may include a driving circuit of the pixel PX described with reference to FIG. 1.

The light emitting element layer 130 may be disposed on the circuit layer 120. The light emitting element layer 130 may include a light emitting element of the pixel PX described with reference to FIG. 1. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and a foreign substance such as dust particles. The encapsulation layer 140 may include at least one inorganic layer. The encapsulation layer 140 may include a stack structure in which an inorganic layer, an organic layer, and an inorganic layer are sequentially stacked.

The input sensor 200 may be disposed on the display panel 100. The input sensor 200 may sense an external input applied thereto from the outside. The external input may include a variety of external inputs, such as a user's body (e.g., finger), light, heat, pen, or pressure.

The input sensor 200 may be formed on the display panel 100 through successive processes. In this case, the input sensor 200 may be disposed directly on the display panel 100. In the descriptions, the expression "a component A is disposed directly on a component B" means that no intervening elements are present between the component A and the component B. For example, an adhesive layer may not be disposed between the input sensor 200 and the display panel 100.

The light control layer 300 may be disposed on the input sensor 200. The light control layer 300 may control a transmission rate of a light provided from the light emitting element layer 130 to correspond to areas of the display panel 100. The light control layer 300 will be described in detail later.

The anti-reflective layer 400 may be disposed on the light control layer 300. The anti-reflective layer 400 may be coupled to the light control layer 300 by an adhesive layer. The adhesive layer may be a pressure sensitive adhesive (PSA) film or an optically clear adhesive (OCA).

The anti-reflective layer 400 may reduce a reflectance of an external light. The anti-reflective layer 400 may include an optical film. The optical film may include a polarizing film. The optical film may further include a retarder film. The retarder film may include at least one of a λ/2 retarder film or a λ/4 retarder film.

The window 500 may include at least one base layer. The base layer may be a glass substrate or a synthetic resin film. The window 500 may have a multi-layer structure. The window 500 may include a thin film glass substrate and a synthetic resin film disposed on the thin film glass substrate. The thin film glass substrate may be coupled to the synthetic resin film by an adhesive layer, and the adhesive layer and the synthetic resin film may be separated from the thin glass substrate to be replaced. The window 500 may further include a functional layer disposed on the base layer. The functional layer may include an anti-reflective layer, an anti-fingerprint layer, or the like.

FIG. 3 shows element areas included in different areas of the display panel 100 (refer to FIG. 2). The display panel 100 may include a first area A1 and a second area A2. The first area A1 and the second area A2 may be disposed spaced apart from each other in first and second diagonal directions CDR1 and CDR2.

The first area A1 may include a first-first element area AE1-B, a first-second element area AE1-G, a first-third element area AE1-R, and a first peripheral area NPXA1. The first peripheral area NPXA1 may surround the first-first element area AE1-B, the first-second element area AE1-G, and the first-third element area AE1-R. The first peripheral area NPXA1 may overlap at least a portion of an edge of each of the first-first element area AE1-B, the first-second element area AE1-G, and the first-third element area AE1-R when viewed in plan.

In the descriptions, each of the first-first element area AE1-B, the first-second element area AE1-G, and the first-third element area AE1-R may be defined as an area in which a first electrode included in light emitting elements for providing lights having different colors from each other is disposed.

As an example, the first-first element area AE1-B may be defined as an area in which a first electrode AE of a first-first light emitting element LD1-B for providing a light having a first color (e.g., blue) is disposed as shown in FIG. 4A.

The first area A1 of the display panel 100 may include a first-first light emitting area PXA-B1 that is defined as an area from which the light generated by the first-first light emitting element LD1-B is substantially emitted.

The first-second element area AE1-G may be defined as an area in which a first electrode AE of a first-second light emitting element LD1-G (refer to FIG. 8) for providing a light having a second color (e.g., green) is disposed.

According to an embodiment, two first-second element areas AE1-G may be provided in one first area A1. One first-second element area AE1-G may be spaced apart from the first-first element area AE1-B in the first diagonal direction CDR1 and may be spaced apart from the first-third element area AE1-R in the second diagonal direction CDR2. The first-second element areas AE1-G may be spaced apart from each other in the first direction DR1. The other first-second element area AE1-G may be spaced apart from the first-first element area AE1-B in the second diagonal direction CDR2 and may be spaced apart from the first-third element area AE1-R in the first diagonal direction CDR1.

The first area A1 of the display panel 100 may include a first-second light emitting area PXA-G1 that is defined as an area from which the light generated by the first-second light emitting element LD1-G is substantially emitted. One first area A1 may include a plurality of first-second light emitting areas PXA-G1. The position and the number of the first-second light emitting areas PXA-G1 may correspond to the position and the number of the first-second element areas AE1-G.

The first-third element area AE1-R may be defined as an area in which a first electrode AE of a first-third light emitting element LD1-R (refer to FIG. 8) for providing a light having a third color (e.g., red) is disposed.

The first area A1 of the display panel 100 may include a first-third light emitting area PXA-R1 that is defined as an area from which the light generated by the first-third light emitting element LD1-R is substantially emitted.

In an embodiment, each of the first-first light emitting area PXA-B1, the first-second light emitting area PXA-G1, and the first-third light emitting area PXA-R1 of the first area A1 may be defined to correspond to a size of a corresponding opening among first openings OP1 (refer to FIG. 4A) defined through a pixel definition layer PDL (refer to FIG. 4A) disposed in the first area A1.

The second area A2 may include a second-first element area AE2-B, a second-second element area AE2-G, a second-third element area AE2-R, and a second peripheral area NPXA2. The second peripheral area NPXA2 may surround the second-first element area AE2-B, the second-second element area AE2-G, the second-third element area AE2-R.

The second-first element area AE2-B may include a plurality of second-first light emitting areas PXA-B2, a first non-light-emitting area NCA-B, and a first boundary area BA-B.

The second-second element area AE2-G may include a plurality of second-second light emitting areas PXA-G2, a second non-light-emitting area NCA-G, and a second boundary area BA-G.

The second-third element area AE2-R may include a plurality of second-third light emitting areas PXA-R2, a third non-light-emitting area NCA-R, and a third boundary area BA-R.

The first boundary area BA-B, the second boundary area BA-G, and the third boundary area BA-R, which are respectively included in the second-first element area AE2-B, the second-second element areas AE2-G, the second-third element area AE2-R, may be defined as an area in which a portion of a first electrode AE (refer to FIG. 4B) is covered by a first pixel definition layer PDL1 described later.

In the descriptions, each of the second-first element area AE2-B, the second-second element area AE2-G, and the second-third element area AE2-R may be defined as an area in which the first electrode included in the light emitting elements for providing the lights having different colors from each other is provided.

As an example, the second-first element area AE2-B may be defined as an area in which a first electrode AE of a second-first light emitting element LD2-B for providing the light having the first color (e.g., blue) is disposed as shown in FIG. 4B.

The second-first element area AE2-B of the display panel 100 may include the second-first light emitting areas PXA-B2 defined as an area from which the light generated by the second-first light emitting element LD2-B is substantially emitted.

According to an embodiment, the second-first element area AE2-B may be provided as four second-first light emitting areas PXA-B2 spaced apart from each other in the first direction DR1 and the second direction DR2 or in the first diagonal direction CDR1 and the second diagonal direction CDR2 with the first non-light-emitting area NCA-B interposed therebetween.

The second-second element area AE2-G may be defined as an area in which a first electrode AE of a second-second light emitting element LD2-G (refer to FIG. 9) for providing the light having the second color (e.g., green) is disposed.

According to an embodiment, two second-second element areas AE2-G may be provided in one second area A2. The second-second element areas AE2-G may be spaced apart from each other in the first direction DR1.

One second-second element area AE2-G may be spaced apart from the second-first element area AE2-B in the first diagonal direction CDR1 and may be spaced from the second-third element area AE2-R in the second diagonal direction CDR2. The other second-second element area AE2-G may be spaced apart from the second-first element area AE2-B in the second diagonal direction CDR2 and may be spaced apart from the second-third element area AE2-R in the first diagonal direction CDR1.

The second-second element area AE2-G of the display panel 100 may include the second-second light emitting areas PXA-G2 defined as an area from which the light generated by the second-second light emitting element LD2-G is substantially emitted.

The second-second light emitting areas PXA-G2 may be grouped into two groups. The second-second light emitting areas PXA-G2 of a first group may overlap one second-second element area AE2-G, and the second-second light emitting areas PXA-G2 of a second group may overlap the other second-second element area AE2-G.

Each of the first group and the second group may include four second-second light emitting areas PXA-G2.

The second-second light emitting areas PXA-G2 of the first group may be spaced apart from the second-first light emitting areas PXA-B2 in the first diagonal direction CDR1 and may be spaced apart from the second-third light emitting areas PXA-R2 in the second diagonal direction CDR2.

The second-second light emitting areas PXA-G2 of the second group may be spaced apart from the second-second light emitting areas PXA-G2 of the first group in the first direction DR1, may be spaced apart from the second-first light emitting areas PXA-B2 in the second diagonal direction CDR2, and may be spaced apart from the second-third light emitting areas PXA-R2 in the first diagonal direction CDR1.

The second-second light emitting areas PXA-G2 included in each of the first and second groups may be provided as four second-second light emitting areas PXA-G2 spaced apart from each other with the second non-light-emitting area NCA-G interposed therebetween in the first direction DR1 and the second direction DR2 or in the first diagonal direction CDR1 and the second diagonal direction CDR2.

The second-third element area AE2-R may be defined as an area in which a first electrode AE of a second-third light emitting element LD2-R (refer to FIG. 9) for providing the light having the third color is disposed. The first color, the second color, and the third color of the lights may be different from each other.

The second-third element area AE2-R of the display panel 100 may include the second-third light emitting areas PXA-R2 defined as an area from which the light generated by the second-third light emitting element LD2-R is substantially emitted.

The second-third element area AE2-R may be provided as four second-third light emitting areas PXA-R2 spaced apart from each other with the third non-light-emitting area NCA-R interposed therebetween in the first direction DR1 and the second direction DR2 or in the first diagonal direction CDR1 and the second diagonal direction CDR2.

According to an embodiment, a size of the first-first element area AE1-B, which provides the light having the first color, in the first area A1, may be smaller than a size of the second-first element area AE2-B, which provides the light having the first color, in the second area A2.

In addition, a size of the first-second element area AE1-G, which provides the light having the second color, in the first area A1, may be smaller than a size of the second-second element area AE2-G, which provides the light having the second color, in the second area A2, and a size of the first-third element area AE1-R, which provides the light having the third color, in the first area A1, may be smaller than a size of the second-third element area AE2-R, which provides the light having the third color, in the second area A2.

According to an embodiment, a size of each of the second-third light emitting areas PXA-R2 may be greater than a size of each of the second-second light emitting areas PXA-G2 and may be smaller than a size of each of the second-first light emitting areas PXA-B2.

The first area A1 and the second area A2 may be provided in plural in the display area 1000A (refer to FIG. 1). The first areas A1 and the second areas A2 may be arranged spaced apart from each other in the first diagonal direction CDR1 and the second diagonal direction CDR2.

The display device DD (refer to FIG. 1) may be operated in two modes. A first operation mode may be a state in which the first-first element area AE1-B, the first-second element areas AE1-G, and the first-third element area AE1-R included in the first areas A1 of the display panel 100 and the second-first element area AE2-B, the second-second element areas AE2-G, the second-third element area AE2-R included in the second areas A2 of the display panel 100 are activated to provide the light to a corresponding light emitting area. A second operation mode may be a state in which the first-first element area AE1-B, the first-second element areas AE1-G, and the first-third element area AE1-R included in the first area A1 are deactivated and only the second-first element area AE2-B, the second-second element areas AE2-G, the second-third element area AE2-R included in the second area A2 are activated to provide the light to the corresponding light emitting area.

Accordingly, a size of the activated light emitting areas in the second operation mode may be relatively smaller than a size of the activated light emitting areas in the first operation mode, and thus, a low pixel image may be provided to a user.

The first operation mode may correspond to a mode in which the display device DD is normally operated. The second operation mode may be used when using the display device DD for a specific purpose. As an example, when the display device is operated in the second mode, the display area is not easily seen by people near the display area but is recognized only by the user. As a result, exposure of personal information of the user may be prevented or minimized.

When the user watches the display device DD from a side, a portion of each of the second-first light emitting area PXA-B2, the second-second light emitting area PXA-G2, and the second-third light emitting area PXA-R2 disposed in the second area A2 may be covered by a light blocking portion (described later) disposed thereabove. In a case where the second-first light emitting area PXA-B2, the second-second light emitting area PXA-G2, and the second-third light emitting area PXA-R2 have different sizes, sizes of the areas covered by the light blocking portion may be different from each other, and as a result, a color shift phenomenon may occur at a specific angle.

FIG. 4A shows a cross-section of an area overlapping the first-first element area AE1-B in the first area A1 as a representative example. Accordingly, details of the first-first element area described with reference to the cross-section of FIG. 4A may be commonly applied to the first-second element area AE1-G and the first-third element area AE1-R of the first area A1.

FIG. 4B shows a cross-section of an area overlapping the second-first element area AE2-B in the second area A2. Accordingly, details of the second-first element area described with reference to the cross-section of FIG. 4B may be commonly applied to the second-second element area AE2-G and the second-third element area AE2-R of the second area A2.

FIG. 4A shows the first-first light emitting element LD1-B and a transistor TFT connected to the first-first light emitting element LD1-B, and FIG. 4B shows the second-first light emitting element LD2-B and a transistor TFT connected to the second-first light emitting element LD2-B. The transistor TFT may be one of a plurality of transistors included in the driving circuit of the pixel PX (refer to FIG. 1). In an embodiment, the transistor TFT will be described as a silicon transistor, however, according to an embodiment, the transistor TFT may be a metal oxide transistor. Hereinafter, common configurations of the first area A1 and the second area A2 will be described together for descriptive convenience.

The base layer 110 may correspond to the base layer 110 described with reference to FIG. 3. A barrier layer 10br may be disposed on the base layer 110. The barrier layer 10br may prevent a foreign substance from entering or permeating thereinto from the outside. The barrier layer 10br may include at least one inorganic layer. The barrier layer 10br may include a silicon oxide layer and a silicon nitride layer. Each of the silicon oxide layer and the silicon nitride layer may be provided in plural, and the silicon oxide layers and the silicon nitride layers may be alternately stacked with each other.

A light shielding electrode BMLa may be disposed on the barrier layer 10br. The light shielding electrode BMLa may include a metal material. The light shielding electrode BMLa may include molybdenum (Mo), an alloy including molybdenum (Mo), titanium (Ti), or an alloy including titanium (Ti), which has a good heat resistance. The light shielding electrode BMLa may receive a bias voltage.

The light shielding electrode BMLa may prevent an electric potential, which is caused by a polarization phenomenon, from exerting influence on the silicon transistor TFT. The light shielding electrode BMLa may prevent an external light from reaching the silicon transistor TFT. According to an embodiment, the light shielding electrode BMLa may be a floating electrode isolated from other electrodes or lines.

A buffer layer 10bf may be disposed on the barrier layer 10br. The buffer layer 10bf may prevent metal atoms or impurities from being diffused to a semiconductor pattern SC1 disposed thereon. The buffer layer 10bf may include at least one inorganic layer. The buffer layer 10bf may include a silicon oxide layer and a silicon nitride layer.

The semiconductor pattern SC1 may be disposed on the buffer layer 10bf. The semiconductor pattern SC1 may include a silicon semiconductor. As an example, the semiconductor pattern SC1 may include amorphous silicon or polycrystalline silicon. For example, the semiconductor pattern SC1 may include low temperature polycrystalline silicon.

The semiconductor pattern may include a first region having a relatively high conductivity and a second region having a relatively low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or a signal line. The second region may substantially correspond to an active area (e.g., a channel) of the transistor. In other words, a portion of the semiconductor pattern may be the active area of the transistor, another portion of the semiconductor pattern may be a source area or a drain area of the transistor, and the other portion of the semiconductor pattern may be a connection electrode or a connection signal line.

A source area SE1 (e.g., a source), the active area AC1 (e.g., a channel), and a drain area DE1 (e.g., a drain) of the transistor TFT may be formed from the semiconductor pattern. The source area SE1 and the drain area DE1 may extend in opposite directions to each other from the active area AC1 in a cross-section.

A first insulating layer 10 may be disposed on the buffer layer 10bf. The first insulating layer 10 may commonly overlap the pixels PX (refer to FIG. 1) and may cover the semiconductor pattern. The first insulating layer 10 may include an inorganic layer and/or an organic layer and may have a single-layer structure or a multi-layer structure.

The inorganic layer may include at least one of aluminum oxide, titanium oxide, silicon oxide, silicon nitride, silicon oxynitride, zirconium oxide, and hafnium oxide.

In an embodiment, the first insulating layer 10 may have a single-layer structure of a silicon oxide layer. Not only the first insulating layer 10, but also an insulating layer of the circuit layer 120 described later may be an inorganic layer and/or an organic layer and may have a single-layer structure or a multi-layer structure. The inorganic layer may include at least one of the above-mentioned materials, however, embodiments should not be limited thereto or thereby.

A gate GT1 of the transistor TFT may be disposed on the first insulating layer 10. The gate GT1 may be a portion of a metal pattern. The gate GT1 may overlap the active area AC1. The gate GT1 may be used as a mask in a process of doping the semiconductor pattern. The gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), or the like, however, embodiments should not be particularly limited.

A second insulating layer 20 may be disposed on the first insulating layer 10 and may cover the gate GT1. A third insulating layer 30 may be disposed on the second insulating layer 20. A storage electrode CT may be disposed between the second insulating layer 20 and the third insulating layer 30. The storage electrode CT may overlap the gate GT1. The gate GT1 and the storage electrode CT may form a capacitor included in the driving circuit of the pixel PX (refer to FIG. 1).

A first connection electrode CNE1 may be disposed on the third insulating layer 30. The first connection electrode CNE1 may be connected to the drain area DE1 of the transistor TFT via a contact hole defined through the first insulating layer 10, the second insulating layer 20, and the third insulating layer 30.

A fourth insulating layer 40 may be disposed on the third insulating layer 30. A second connection electrode CNE2 may be disposed on the fourth insulating layer 40. The second connection electrode CNE2 may be connected to the first connection electrode CNE1 via a contact hole defined through the fourth insulating layer 40. A fifth insulating layer 50 may be disposed on the fourth insulating layer 40 and may cover the second connection electrode CNE2. The stack structure of the first insulating layer 10 to the fifth insulating layer 50 is one example. For example, additional conductive layer and insulating layer may be disposed in addition to the first insulating layer 10 to fifth insulating layer 50.

Each of the fourth insulating layer 40 and the fifth insulating layer 50 may include an organic layer. As an example, the organic layer may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The light emitting elements LD1-B and LD2-B may include the first electrode AE (e.g., a pixel electrode), a light emitting layer EL, and a second electrode CE (e.g., a common electrode). The first electrode AE may be disposed on the fifth insulating layer 50. The first electrode AE may be a semi-transmissive electrode, a transmissive electrode, or a reflective electrode. According to an embodiment, the first electrode AE may include a reflective layer formed of Ag, Mg, Al, Pt, Pd, Au, Ni, Nd, Ir, Cr, or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide (In2O3), and aluminum-doped zinc oxide (AZO). For instance, the first electrode AE may have a stack structure of ITO/Ag/ITO.

According to an embodiment, the first area A1 may include the pixel definition layer PDL. The pixel definition layer PDL may be disposed on the fifth insulating layer 50. The pixel definition layer PDL may be provided with the first opening OP1 defined therethrough to expose at least a portion of the first electrode AE of the light emitting element LD1-B. The pixel definition layer PDL of the first area A1 may cover a portion of the first electrode AE.

As described above, the first-first light emitting area PXA-B1 of the first area A1, from which the light generated by the light emitting element LD1-B is provided, may be determined by a size of the first opening OP1 defined through the pixel definition layer PDL of the first area A1. The first peripheral area NPXA1 defined adjacent to the first-first light emitting area PXA-B1 may be defined as an area overlapping the pixel definition layer PDL of the first area A1.

The second area A2 may include a first pixel definition layer PDL1 and the second pixel definition layer PDL2. The first pixel definition layer PDL1 and the second pixel definition layer PDL2 may be disposed on the fifth insulating layer 50. The first pixel definition layer PDL1 may be provided with a second opening OP2 defined therethrough to expose at least a portion of the first electrode AE of the second-first light emitting element LD2-B. The first pixel definition layer PDL1 of the second area A2 may cover a portion of the first electrode AE.

The second pixel definition layer PDL2 may be disposed on the first electrode AE exposed through the second opening OP2 without being covered by the first pixel definition layer PDL1. The second pixel definition layer PDL2 may be disposed on the first electrode AE and may define the first non-light-emitting area NCA-B of FIG. 3. Accordingly, the second-first light emitting areas PXA-B2 may be disposed on one first electrode AE disposed in the second area A2 of the display panel 100. Each of the second-first light emitting areas PXA-B2 may be disposed adjacent to a main non-light-emitting area NCA-M and the first non-light-emitting area NCA-B. The main non-light-emitting area NCA-M may overlap the first pixel definition layer PDL1, and the first non-light-emitting area NCA-B may overlap the second pixel definition layer PDL2. The main non-light-emitting area NCA-M may overlap the second peripheral area NPXA2.

According to an embodiment, a boundary between the light emitting areas and the non-light-emitting areas in the second area A2 may be determined by light blocking patterns described later.

For example, a hole control layer may be disposed between the first electrode AE and the light emitting layer EL. The hole control layer may include a hole transport layer and may further include a hole injection layer. An electron control layer may be disposed between the light emitting layer EL and the second electrode CE. The electron control layer may include an electron transport layer and may further include an electron injection layer.

The encapsulation layer 140 may be disposed on the light emitting elements LD1-B and LD2-B. The encapsulation layer 140 may include an inorganic layer 141, an organic layer 142, and an inorganic layer 143, which are sequentially stacked, however, layers included in the encapsulation layer 140 should not be limited thereto or thereby.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Figure 5:
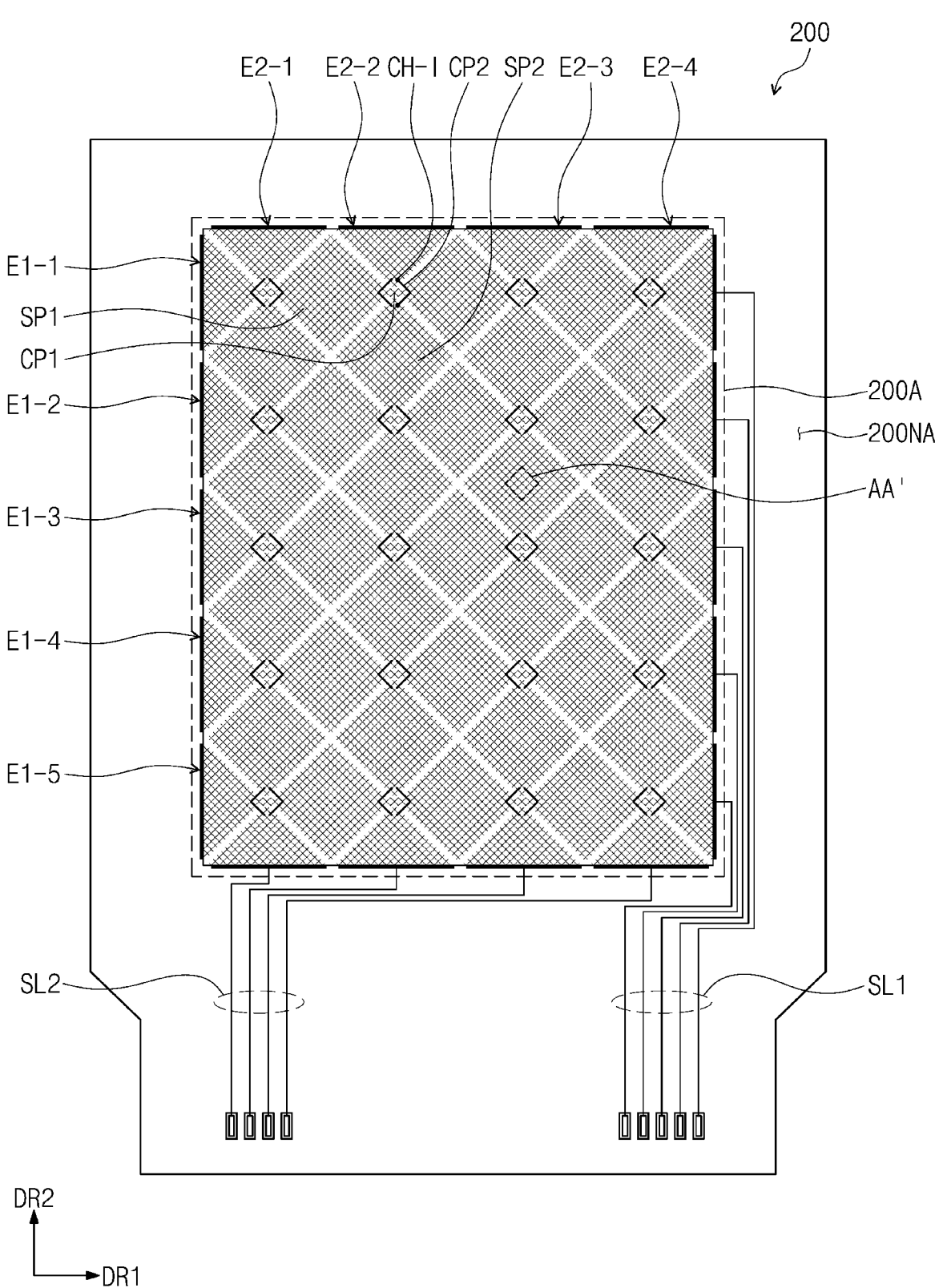
FIG. 5 is a plan view of an input sensor of the display device of FIG. 1.

FIG. 5 is a plan view of the input sensor 200 according to an embodiment.

Referring to FIG. 5, the input sensor 200 may include a sensing area 200A and a non-sensing area 200NA adjacent to the sensing area 200A. The sensing area 200A and the non-sensing area 200NA may correspond to the display area 1000A and the non-display area 1000N shown in FIG. 1, respectively.

The input sensor 200 may include first sensing electrodes E1-1 to E1-5 and second sensing electrodes E2-1 to E2-4, which are disposed in sensing area 200A and are insulated from each other while intersecting each other. The external input may be sensed by calculating a variation in mutual capacitance formed between the first sensing electrodes E1-1 to E1-5 and the second sensing electrodes E2-1 to E2-4.

The input sensor 200 may include first signal lines SL1 disposed in the non-sensing area 200NA and electrically connected to the first sensing electrodes E1-1 to E1-5 and second signal lines SL2 disposed in the non-sensing area 200NA and electrically connected to the second sensing electrodes E2-1 to E2-4.

Each of the first sensing electrodes E1-1 to E1-5 and the second sensing electrodes E2-1 to E2-4 may include a plurality of conductive lines intersecting each other. Each of the first sensing electrodes E1-1 to E1-5 and the second sensing electrodes E2-1 to E2-4 may include mesh lines. The mesh lines may be provided with a plurality of openings defined therethrough to overlap the light emitting areas included in the first area A1 and the second area A2.

One of the first sensing electrodes E1-1 to E1-5 and the second sensing electrodes E2-1 to E2-4 may be provided integrally. In an embodiment, the first sensing electrodes E1-1 to E1-5 are integrally provided. The first sensing electrodes E1-1 to E1-5 may include sensing portions SP1 and intermediate portions CP1.

Each of the second sensing electrodes E2-1 to E2-4 may include sensing patterns SP2 and bridge patterns CP2 (e.g., connection patterns). Two sensing patterns SP2 adjacent to each other may be connected to two bridge patterns CP2 via a contact hole CH-I defined through a second sensing insulating layer IL2 (refer to FIG. 8), however, the number of the bridge patterns should not be particularly limited.

Figure 6A:
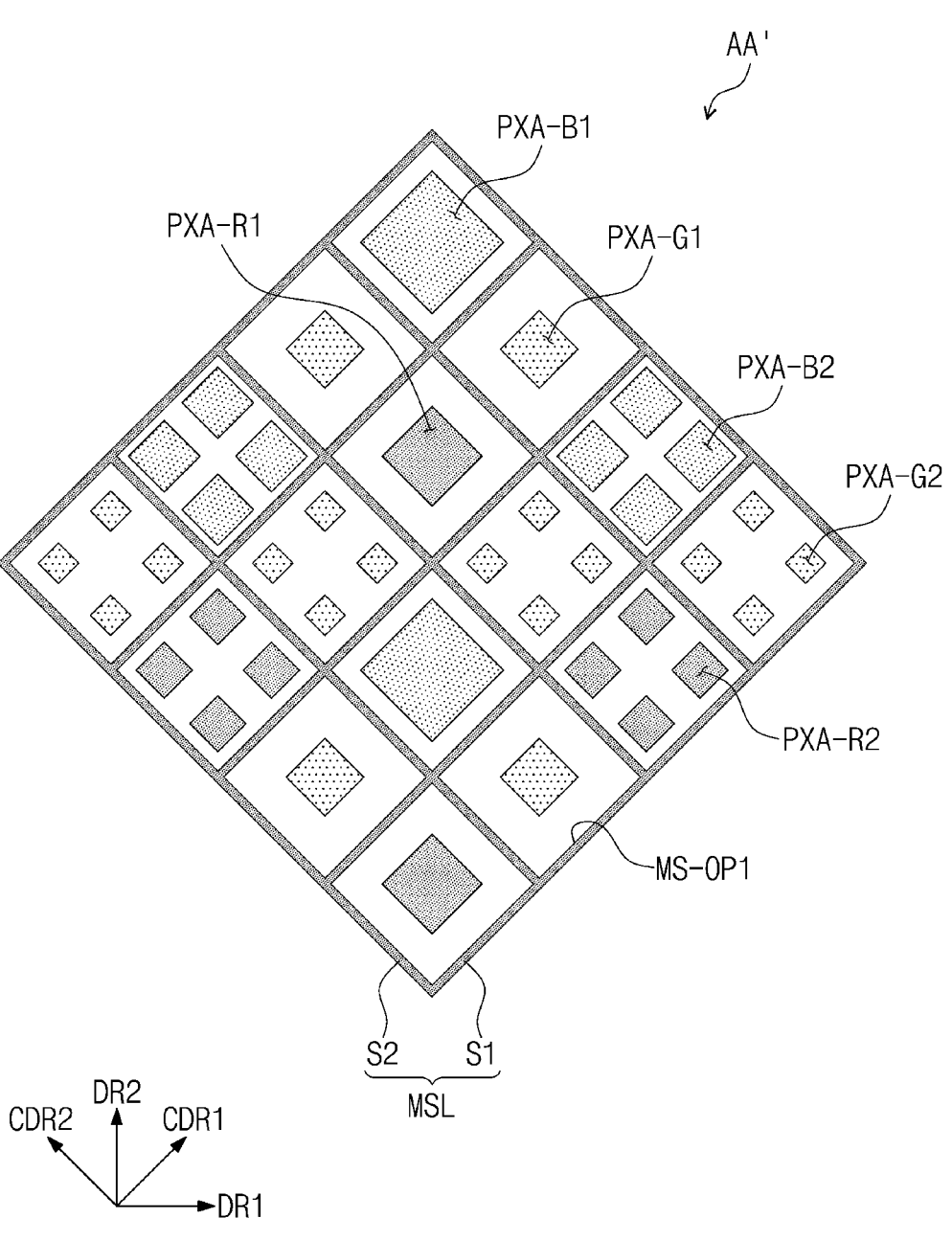
FIG. 6A is an enlarged plan view of an area AA' of FIG. 5 illustrating an embodiment of the input sensor of FIG. 5.
Figure 6B:
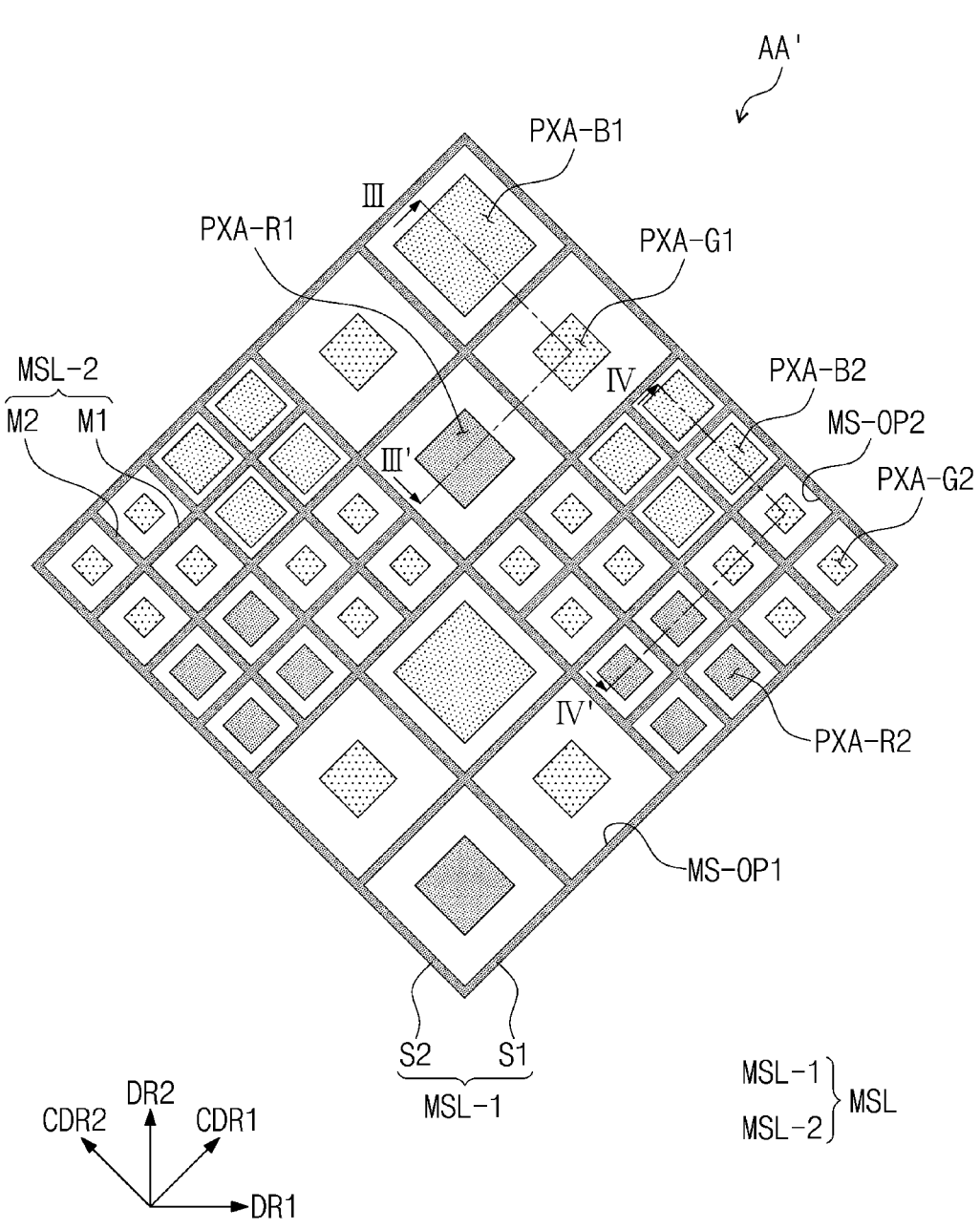
FIG. 6B is an enlarged plan view of an area AA' of FIG. 5 illustrating another embodiment of the input sensor of FIG. 5.
Figure 7:
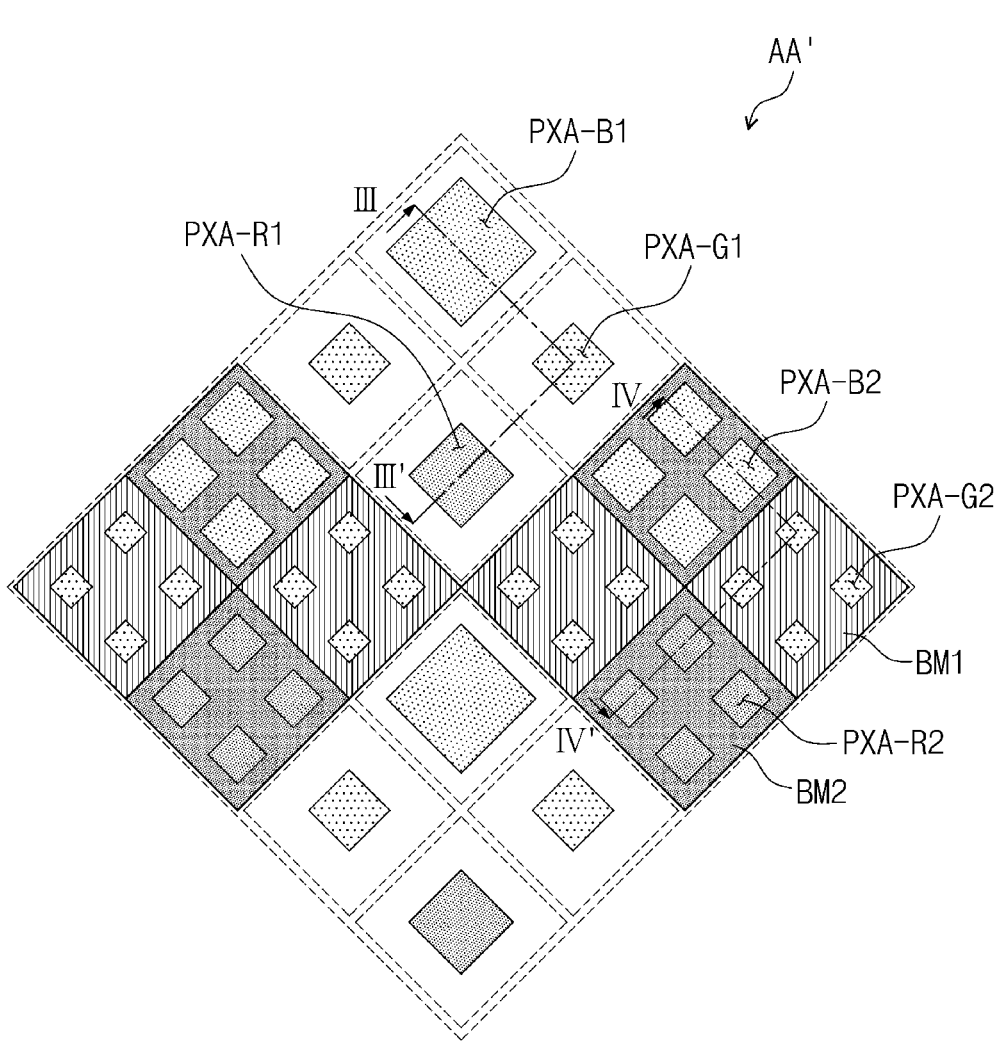
FIG. 7 is an enlarged plan view of an area AA' of FIG. 5 illustrating an embodiment of the input sensor of FIG. 5 and an embodiment of a light control layer of the display device of FIG. 1.
Figure 7:
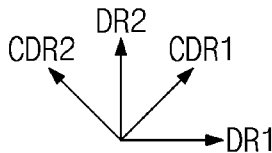
Figure 8:
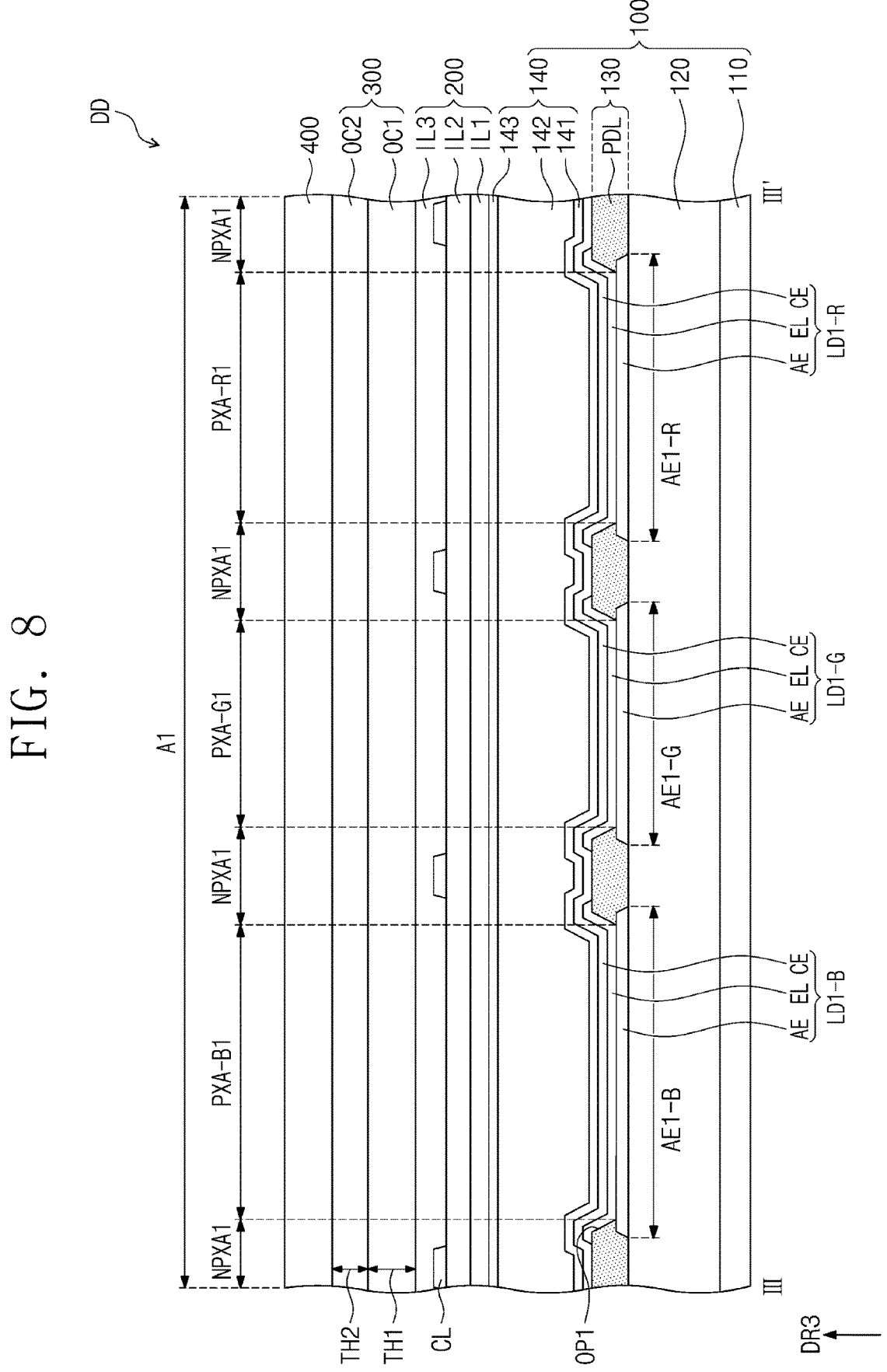
FIG. 8 is a cross-sectional view taken along a line III-III' of FIGS. 6B and 7.
Figure 9:
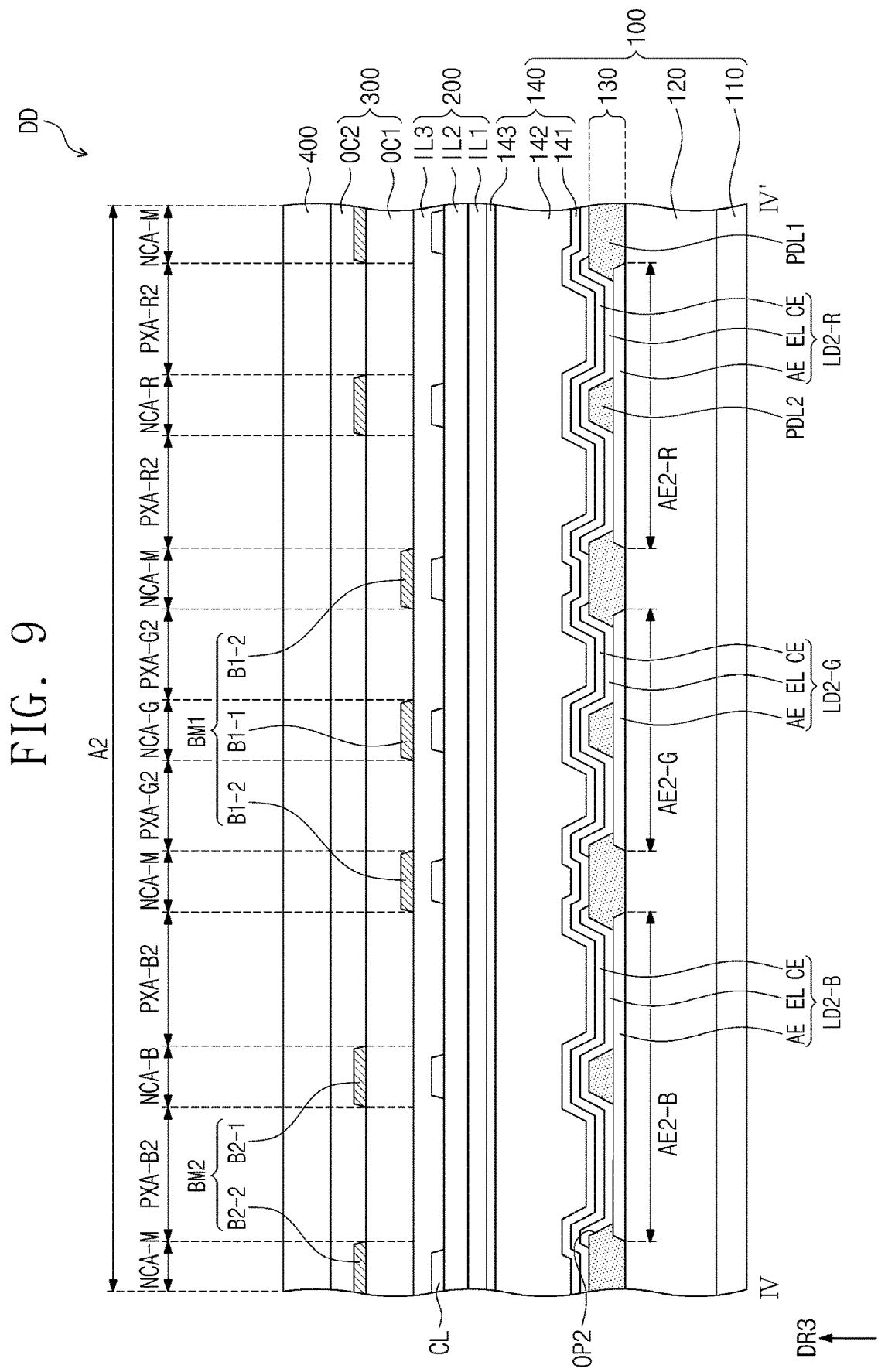
FIG. 9 is a cross-sectional view taken along a line IV-IV' of FIGS. 6B and 7.

FIG. 6A is an enlarged plan view of an area AA' of FIG. 5. FIG. 6B is an enlarged plan view of an area AA' of FIG. 5. FIG. 7 is an enlarged plan view of an area AA' of FIG. 5. FIG. 8 is a cross-sectional view taken along a line III-III' of FIGS. 6B and 7. FIG. 9 is a cross-sectional view taken along a line IV-IV' of FIGS. 6B and 7.

Referring to FIG. 6A, the sensing patterns SP2 among the first sensing electrodes E1-1 to E1-5 (refer to FIG. 5) and the second sensing electrodes E2-1 to E2-4 (refer to FIG. 5) may include mesh lines MSL extending in the first diagonal direction CDR1 and the second diagonal direction CDR2.

In an embodiment, the mesh lines MSL may include a first line S1 and a second line S2. The first line S1 may extend in the first diagonal direction CDR1, and the second line S2 may extend in the second diagonal direction CDR2. The first lines S1 and the second lines S2 may be patterns that are integrally provided with each other and extending from each other, however, for the convenience of explanation, the first lines S1 and the second lines S2 will be described separately from each other.

As the first line S1 and the second line S2 are disposed to cross each other, the mesh lines MSL may be provided with mesh openings MS-OP1. In an embodiment, the mesh openings MS-OP1 may have the substantially same shape as each other.

In an embodiment, each of the first-first light emitting area PXA-B1, first-second light emitting area PXA-G1, and the first-third light emitting area PXA-R1 of the first area A1 may be surrounded by a corresponding opening among the mesh openings MS-OP1. Accordingly, each of the mesh openings MS-OP1 overlapping the first area A1 may surround one light emitting area.

The second-first light emitting area PXA-B2, the second-second light emitting area PXA-G2, and the second-third light emitting area PXA-R2 of the second area A2 may be provided such that light emitting areas for providing the substantially same color are surrounded by one mesh opening MS-OP1. For example, four second-first light emitting areas PXA-B2 may be surrounded by one mesh opening MS-OP1, four second-second light emitting areas PXA-G2 of the first group may be surrounded by another mesh opening MS-OP1, four second-second light emitting areas PXA-G2 of the second group may be surrounded by another mesh opening MS-OP1, and four second-third light emitting areas PXA-R2 may be surrounded by the other mesh opening MS-OP1.

FIG. 6B shows an arrangement relationship between the sensing electrodes and the light emitting areas disposed in the first area A1 and the second area A2 when viewed in plan, and FIG. 7 shows an arrangement relationship between first and second light blocking portions BM1 and BM2 disposed on the light control layer 300 and the light emitting areas disposed in the first area A1 and the second area A2.

Figure 10:
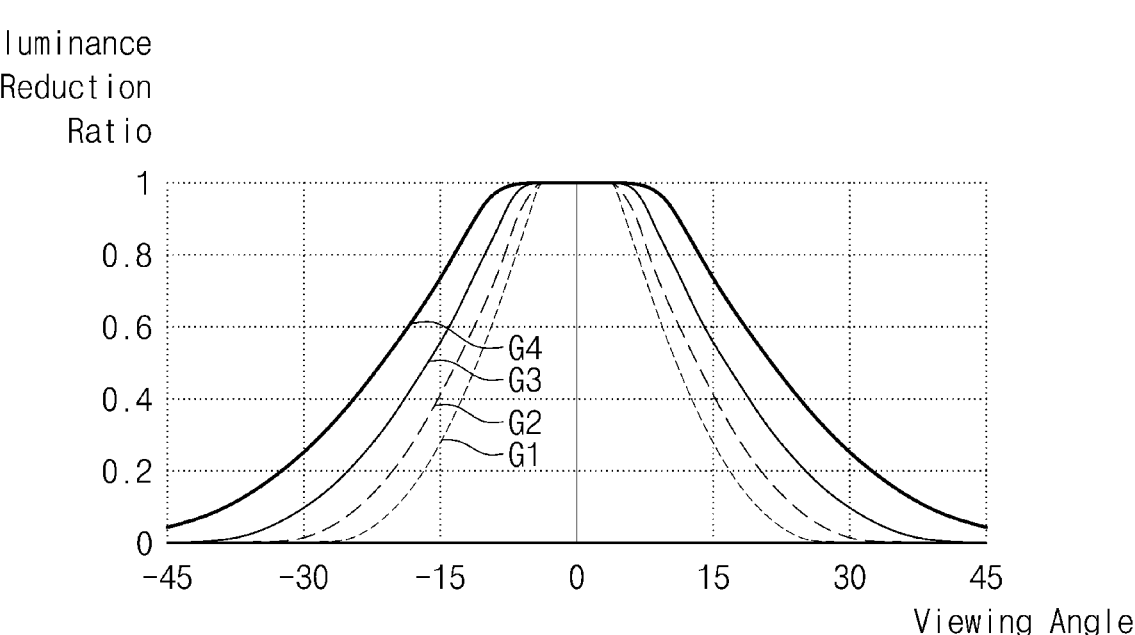
FIG. 10 is a graph showing a luminance reduction ratio of a light emitting area of the display panel of FIG. 3 according to a distance between the light emitting layer and a light blocking pattern of the light control layer of FIG. 7.

FIG. 8 is a cross-sectional view taken along a line III-III' of FIGS. 6B and 7 in a state where the display panel 100, the input sensor 200, the light control layer 300, and the anti-reflective layer 400 are stacked, and FIG. 9 is a cross-sectional view taken along a line IV-IV' of FIGS. 6B and 7 in a state where the display panel 100, the input sensor 200, the light control layer 300, and the anti-reflective layer 400 are stacked. FIG. 10 is a graph showing a luminance reduction ratio of the light emitting area according to a distance between the light emitting layer and the light blocking pattern.

Referring to FIG. 6B, the sensing patterns SP2 among the first sensing electrodes E1-1 to E1-5 (refer to FIG. 5) and the second sensing electrodes E2-1 to E2-4 (refer to FIG. 5) may include the mesh lines MSL extending in the first diagonal direction CDR1 and the second diagonal direction CDR2.

The mesh lines MSL may include first mesh lines MSL-1 in an area overlapping the first area A1 and second mesh lines MSL-2 in an area overlapping the second area A2.

The first mesh lines MSL-1 may include a first-first line S1 and a first-second line S2. The first-first line S1 may extend in the first diagonal direction CDR1, and the first-second line S2 may extend in the second diagonal direction CDR2.

The first-first line S1 and the first-second line S2 may be provided with first mesh openings MS-OP1 defined therethrough to overlap the first-first light emitting area PXA-B1, the first-second light emitting area PXA-G1, and the first-third light emitting area PXA-R1 included in the first area A1.

Accordingly, the light from the first-first light emitting area PXA-B1, the first-second light emitting area PXA-G1, and the first-third light emitting area PXA-R1 may be emitted with being influence by the first-first line S1 and the first-second line S2.

In an embodiment, each of the first-first light emitting area PXA-B1, the first-second light emitting area PXA-G1, and the first-third light emitting area PXA-R1 of the first area A1 may be surrounded by a corresponding opening among the first mesh openings MS-OP1. Accordingly, each of the first mesh openings MS-OP1 overlapping the first area A1 may surround one light emitting area.

The second mesh lines MSL-2 may include a second-first line M1 and a second-second line M2. The second-first line M1 may extend in the first diagonal direction CDR1, and the second-second line M2 may extend in the second diagonal direction CDR2.

The second-first line M1 and the second-second line M2 may be provided with second mesh openings MS-OP2 defined therethrough to overlap the second-first light emitting area PXA-B2, the second-second light emitting area PXA-G2, and the second-third light emitting area PXA-R2 included in the second area A2.

Accordingly, the light from the second-first light emitting area PXA-B2, the second-second light emitting area PXA-G2, and the second-third light emitting area PXA-R2 may be emitted without being influenced by the second-first line M1 and the second-second line M2. In an embodiment, each of the first mesh openings MS-OP1 has a size greater than a size of each of the second mesh openings MS-OP2.

In an embodiment, each of the second-first light emitting area PXA-B2, the second-second light emitting area PXA-G2, and the second-third light emitting area PXA-R2 of the second area A2 may be surrounded by a corresponding opening among the second mesh openings MS-OP2. Accordingly, each of the second mesh openings MS-OP2 overlapping the second area A2 may surround one light emitting area.

Referring to FIG. 7, the first light blocking portion BM1 and the second light blocking portion BM2, which are disposed on different layers from each other, may be disposed in the second area A2. In FIG. 7, mesh lines that do not overlap the first light blocking portion BM1 and the second light blocking portion BM2 among the mesh lines MSL shown in FIG. 6B are shown by a dotted line. In addition, the first light blocking portion BM1 and the second light blocking portion BM2, which are disposed on different layers from each other, are shown by different hatching.

The first light blocking portion BM1 and the second light blocking portion BM2 may be disposed only in the second area A2 and may not overlap the first area A1. According to an embodiment, the first light blocking portion BM1 may be disposed adjacent to light emitting areas having the smallest size among the light emitting areas included in the second area A2.

The first light blocking portion BM1 may disposed to surround the second-second light emitting areas PXA-G2. The second light blocking portion BM2 may be disposed to surround the second-first light emitting areas PXA-B2 and the second-third light emitting areas PXA-R2. According to an embodiment, a material for the first light blocking portion BM1 and the second light blocking portion BM2 should not be particularly limited as long as the material may absorb the light.

The display panel 100, the input sensor 200, the light control layer 300, and the anti-reflective layer 400 shown in FIGS. 8 and 9 may correspond to the display panel 100, the input sensor 200, the light control layer 300, and the anti-reflective layer 400 described with reference to FIGS. 2, 4A, and 4B.

The input sensor 200 may include a first sensing insulating layer IL1, the second sensing insulating layer IL2, and a third sensing insulating layer IL3. The first sensing insulating layer IL1 may be disposed on the encapsulation layer 140.

Among the second sensing electrodes E2-1 to E2-4 described with reference to FIG. 5, the bridge patterns CP2 may be disposed on the first sensing insulating layer IL1.

The second sensing insulating layer IL2 may be disposed on the first sensing insulating layer IL1. Among the first sensing electrodes E1-1 to E1-5 and the second sensing electrodes E2-1 to E2-4 described with reference to FIG. 5, the sensing patterns SP2 may be disposed on the second sensing insulating layer IL2.

The sensing patterns SP2 may be connected to corresponding sensing patterns SP2 via a contact hole defined through the second sensing insulating layer IL2. The third sensing insulating layer IL3 may be disposed on the second sensing insulating layer IL2. The first, second, and third sensing insulating layers IL1, IL2, and IL3 may include an inorganic material.

Hereinafter, sensing electrodes CL described with reference to FIGS. 8 and 9 may correspond to one of the sensing patterns SP2 of the first sensing electrodes E1-1 to E1-5 and the second sensing electrodes E2-1 to E2-4.

The light control layer 300 may include a first cover layer OC1, a second cover layer OC2, the first light blocking portion BM1, and the second light blocking portion BM2. The first cover layer OC1 may be disposed on the third sensing insulating layer IL3 of the input sensor 200. Each of the first cover layer OC1 and the second cover layer OC2 may include an organic material. As an example, at least one of the first cover layer OC1 and the second cover layer OC2 may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

In an embodiment, the first cover layer OC1 may have a first thickness TH1 greater than a second thickness TH2 of the second cover layer OC2. As an example, the first thickness TH1 of the first cover layer OC1 may be within a range from about 4 μm to about 9 um, and the second thickness TH2 of the second cover layer OC2 may be within a range from about 0.5 μm to about 3 μm.

Referring to FIG. 8, the first light blocking portion BM1 and the second light blocking portion BM2 may not overlap the first area A1. Accordingly, the first-first light emitting area PXA-B1, the first-second light emitting area PXA-G1, and the first-third light emitting area PXA-R1, from which the lights generated by the first-first element area AE1-B, the first-second element areas AE1-G, and the first-third element area AE1-R are emitted, may be defined by sizes of corresponding openings among the first openings OP1 defined through the pixel definition layer PDL. In addition, the first peripheral area NPXA1 of the first area A1 may overlap the pixel definition layer PDL.

Referring to FIG. 9, the first light blocking portion BM1 and the second light blocking portion BM2 may be disposed only in the second area A2. In an embodiment, the first light blocking portion BM1 may be disposed on the third sensing insulating layer IL3 and may be covered by the first cover layer OC1. The second light blocking portion BM2 may be disposed on the first cover layer OC1 and may be covered by the second cover layer OC2. For example, the first light blocking portion BM1 and the second light blocking portion BM2 may be disposed on different layers, respectively. For example, the first light blocking portion BM1 and the second light blocking portion BM2 at different levels from the base layer 110 of the display panel 100. For example, the second light blocking portion BM2 may be farther away from the display panel 100 than the first light blocking portion BM1 in a vertical direction (e.g., a third direction DR3).

The first light blocking portion BM1 may include a first light blocking pattern B1-1 and a first additional light blocking pattern B1-2. The first light blocking pattern B1-1 may be disposed on the second pixel definition layer PDL2 disposed on the first electrode AE of the second-second light emitting element LD2-G. Accordingly, the first light blocking pattern B1-1 may be disposed in the second-second element area AE2-G. The first light blocking pattern B1-1 may define the second non-light-emitting area NCA-G of the second-second element area AE2-G.

The first additional light blocking pattern B1-2 may be disposed on the first pixel definition layer PDL1 disposed between the second-first light emitting element LD2-B and the second-second light emitting element LD2-G and the first pixel definition layer PDL1 disposed between the second-third light emitting element LD2-R and the second-second light emitting element LD2-G. Accordingly, the first additional light blocking pattern B1-2 may define the main non-light-emitting area NCA-M adjacent to the second non-light-emitting area NCA-G.

In an embodiment, the first light blocking pattern B1-1 and the first additional light blocking pattern B1-2 may include the substantially same material and may be provided integrally with each other as a single pattern.

The second light blocking portion BM2 may include a second light blocking pattern B2-1 and a second additional light blocking pattern B2-2. The second light blocking pattern B2-1 may be disposed on the second pixel definition layer PDL2 disposed on the first electrode AE of the second-first light emitting element LD2-B and the first electrode AE of the second-third light emitting element LD2-R. Accordingly, the second light blocking pattern B2-1 may be disposed on the second-first element area AE2-B and the second-third element area AE2-R. Accordingly, the second light blocking pattern B2-1 may define the first non-light-emitting area NCA-B and the third non-light-emitting area NCA-R.

The second additional light blocking pattern B2-2 may be disposed on the first pixel definition layer PDL1 disposed between the second-first light emitting element LD2-B and the second-third light emitting element LD2-R (e.g., in a horizontal direction). Accordingly, the second additional light blocking pattern B2-2 may define the main non-light-emitting area NCA-M between the first non-light-emitting area NCA-B and the third non-light-emitting area NCA-R.

The second light blocking pattern B2-1 and the second additional light blocking pattern B2-2 may include the substantially same material and may be integrally provided with each other as a single pattern.

The second-first light emitting area PXA-B2, the second-second light emitting area PXA-G2, and the second-third light emitting area PXA-R2, the first non-light-emitting area NCA-B, the second non-light-emitting area NCA-G, and the third non-light-emitting area NCA-R, and the main non-light-emitting area NCA-M of the second area A2 may be defined by positions at which the first light blocking portion BM1 and the second light blocking portion BM2 including a light blocking material are disposed.

Definitions of the first non-light-emitting area NCA-B, the second non-light-emitting area NCA-G, the third non-light-emitting area NCA-R, and the main non-light-emitting area NCA-M of the second area A2, which will be described hereinafter, are the same as the details described above for descriptive convenience.

According to an embodiment, when the display device DD (refer to FIG. 1) is operated in the second operation mode, the display area 1000A (refer to FIG. 1) may not be visible to people near the display device DD since the display device DD may include the first light blocking portion BM1 and the second light blocking portion BM2 disposed in the second area A2. Accordingly, the display device DD with improved performance in the private mode may be provided.

According to an embodiment, the second-second element area AE2-G may have a relatively smaller size than that of the second-first element area AE2-B and the second-third element area AE2-R. The first light blocking portion BM1 may be disposed in an area adjacent to the second-second element area AE2-G, and the second light blocking portion BM2 may be disposed in the second-first element area AE2-B and the second-third element area AE2-R. The second light blocking portion BM2 may be placed relatively far from the display panel 100 than the first light blocking portion BM1.

Since the first and second light blocking portions BM1 and BM2 are disposed in the second area A2, the size of the light blocking area of the second-first element area AE2-B, the second-second element areas AE2-G, the second-third element area AE2-R included in second area A2 may increase as the viewing angle at which the user looks at the display device DD from the side increases.

Different from the embodiments, in a case of a comparative embodiment in which the light blocking portion disposed in the second area A2 has the substantially same distance from the display panel 100 regardless of the size of the element area, the second-second element area AE2-G, which has the smallest area, has a relatively greater light blocking rate (which is defined as a ratio of the size of the area covered by the light blocking portion to the size of the element area) than that of the second-first element area AE2-B and the second-third element area AE2-R at the same viewing angle, and accordingly, an amount of the second color light emitted from the second-second element area AE2-G is reduced. As a result, the color shift phenomenon occurs in the second area A2 at a specific angle.

As an example, in a case where the first color light, the second color light, and the third color light, respectively, generated from the second-first element area AE2-B, the second-second element area AE2-G, and the second-third element area AE2-R are the blue, green, and red colors, respectively, in the comparative example, the amount of emission of the second color light is reduced in the second area A2, and thus, the light having a pinkish color is emitted in the second area A2, that is, a pinkish phenomenon occurs.

According to an embodiment, the first light blocking portion BM1 is disposed in an area adjacent to the second-second element area AE2-G having the smallest size, and the second light blocking portion BM2 is disposed in an area adjacent to the second-first element area AE2-B and the second-third element area AE2-R. Accordingly, the reduction of the emission rate of the second color light in the second area A2 may be prevented. Hereinafter, the effect of the embodiments will be described in more detail with reference to FIG. 10.

FIG. 10 is a graph showing a variation of a luminance ratio of the element area with a viewing angle for a distance between the element area and the light blocking portion.

The distance between the element area and the light blocking portion may decrease in the order of a first graph G1, a second graph G2, a third graph G3, and a fourth graph G4. The reduction in the luminance ratio of the element area may decrease from the first graph G1 to the fourth graph G4 in the same viewing angle. As an example, when the viewing angle is about +15 degrees in the first graph G1, the luminance ratio may have a luminance ratio that is reduced by about 70% or more compared to a viewing angle of about zero (0) degree, and when the viewing angle is about +15 degrees in the fourth graph G4, the luminance ratio may have a luminance ratio that is reduced by about 30% or less compared to the viewing angle of about zero (0) degree.

Accordingly, as the distance between the element area and the light blocking portion decreases, the reduction of the luminance ratio at the specific viewing angle may decrease.

As shown in FIG. 10, as the first light blocking portion BM1, which is closer to the display panel 100 than the second light blocking portion BM2 is in the display device DD (refer to FIG. 1) in the vertical direction (e.g., the third direction DR3), is disposed in the second-second element area AE2-G having a relatively small area, the reduction of the luminance ratio according to the specific viewing angle may decrease more in the second-second element area AE2-G than in the second-first element area AE2-B and the second-third element area AE2-R. Therefore, the reduction in the emission rate of the second color light generated by the second-second element area AE2-G of the second area A2 may be prevented, and thus, the color shift phenomenon may be reduced when the display device DD is operated in the private mode.

Figure 11:
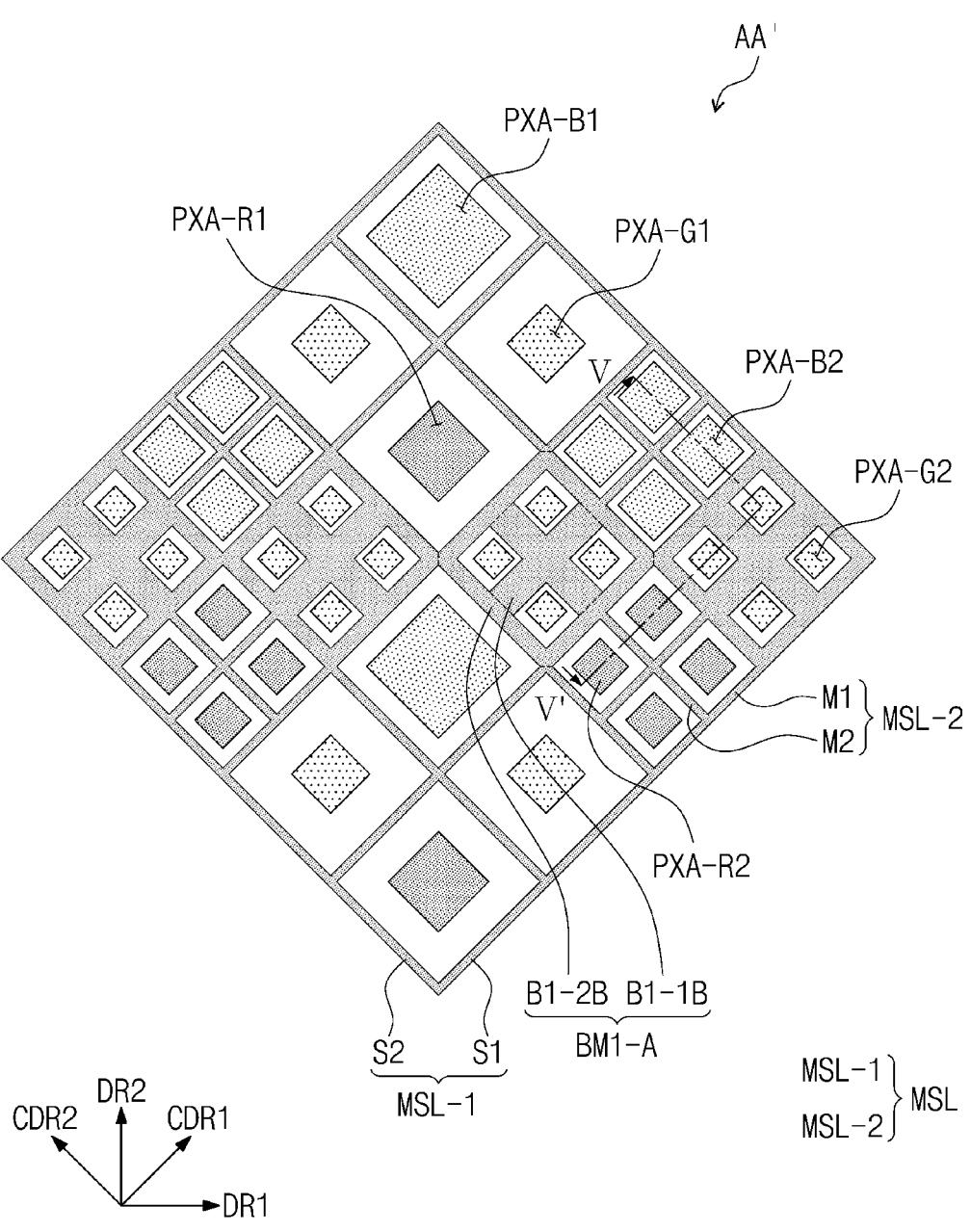
FIG. 11 is a plan view of a relationship between a sensing electrode of the input sensor of FIG. 5 and light emitting areas of the display panel of FIG. 3.
Figure 12:
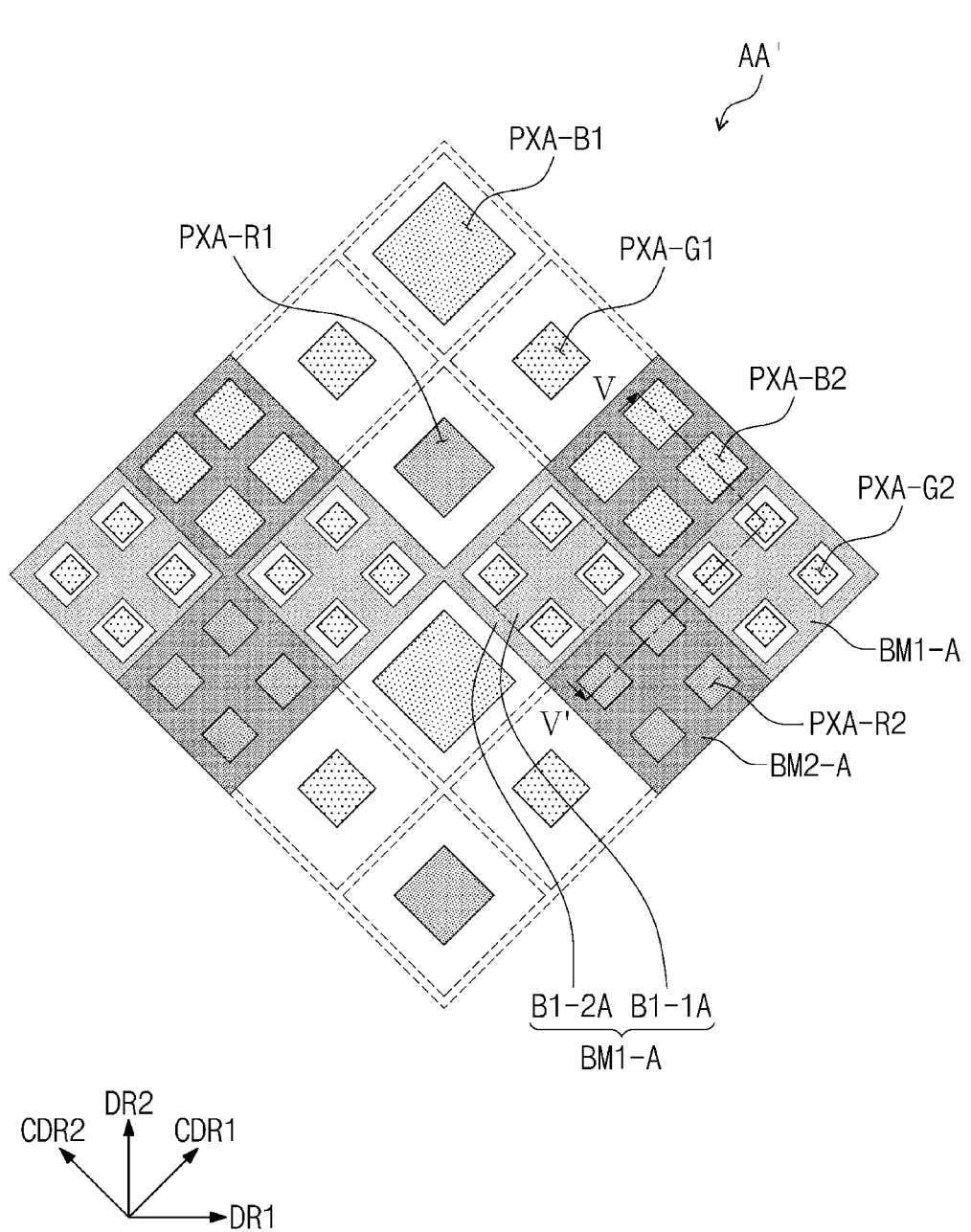
FIG. 12 is a plan view of a relationship between the sensing electrode of the input sensor of FIG. 5, the light blocking pattern of the light control layer of FIG. 7, and the light emitting areas of the display panel of FIG. 3.
Figure 13:
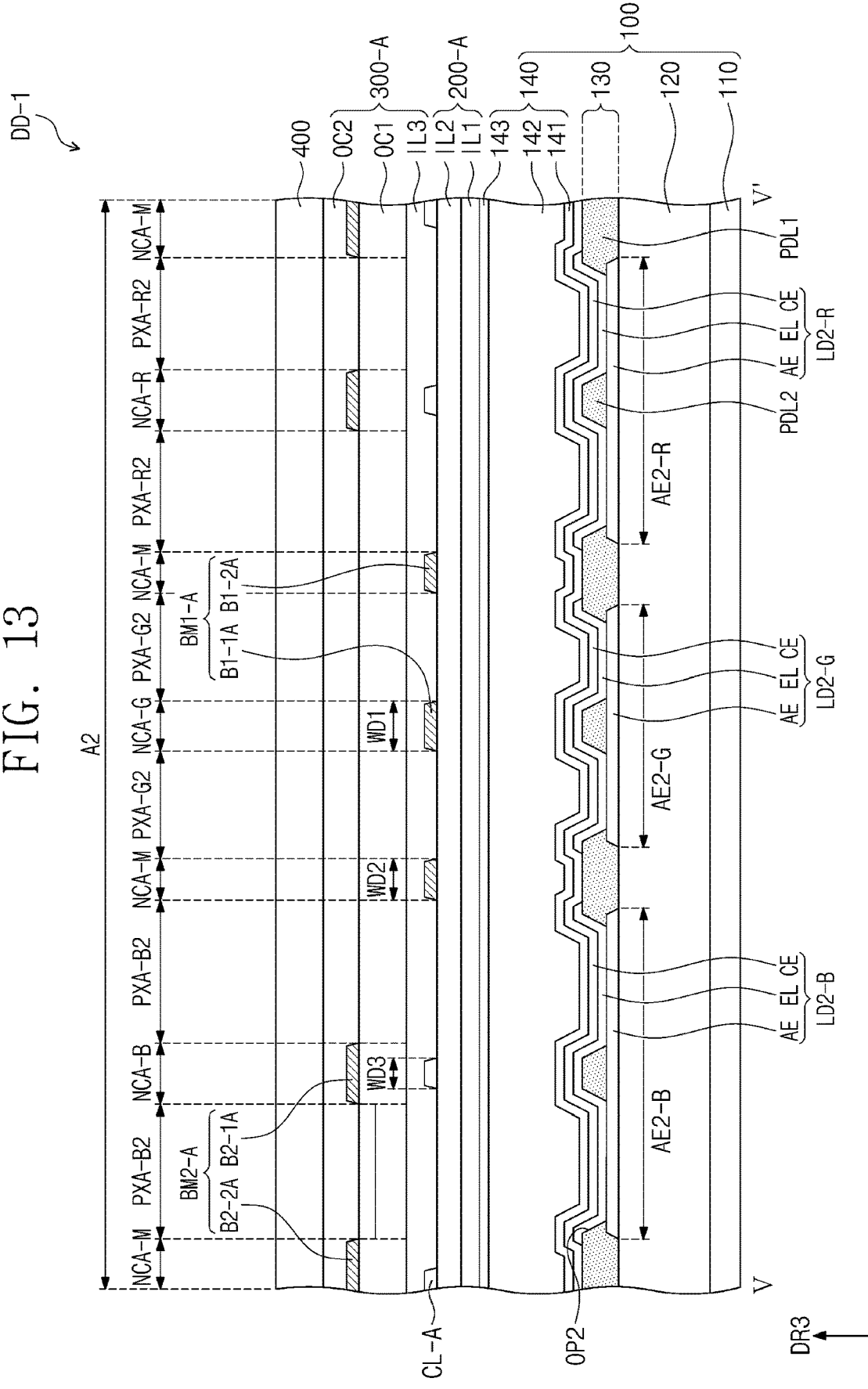
FIG. 13 is a cross-sectional view taken along a line V-V' of FIGS. 11 and 12.

FIG. 11 is a plan view of a relationship between a sensing electrode and light emitting areas according to an embodiment. FIG. 12 is a plan view of a relationship between the sensing electrode, a light blocking pattern, and the light emitting areas according to an embodiment. FIG. 13 is a cross-sectional view taken along a line V-V' of FIGS. 11 and 12.

FIGS. 11 and 12 are enlarged plan views corresponding to the area AA' of FIG. 5. FIG. 11 shows an arrangement relationship between the sensing electrodes and the light emitting areas disposed in the first area A1 (refer to FIG. 3) and the second area A2 (refer to FIG. 3) when viewed in plan, and FIG. 12 shows an arrangement relationship between light blocking portions BM1-A and BM2-A disposed in a light control layer 300-A and the light emitting areas disposed in the first area A1 and the second area A2. In FIG. 12, mesh lines that do not overlap the light blocking portions BM1-A and BM2-A among mesh lines MSL shown in FIG. 11 are illustrated by a dotted line.

The mesh lines MSL described with reference to FIGS. 11, 12, and 13 may be included in one of the sensing patterns SP2 of the first sensing electrodes E1-1 to E1-5 and the second sensing electrodes E2-1 to E2-4 described with reference to FIG. 5.

Referring to FIGS. 11, 12, and 13, the first light blocking portion BM-1A included in the light control layer 300-A may be disposed on the same layer (e.g., the second sensing insulating layer IL2) as the layer on which the mesh lines MSL are disposed.

First mesh lines MSL-1 of the mesh lines MSL may include a first-first line S1 and a first-second line S2. The first-first line S1 may extend in the first diagonal direction CDR1, and the first-second line S2 may extend in the second diagonal direction CDR2. The first mesh lines MSL-1 may surround the first-first light emitting area PXA-B1, the first-second light emitting area PXA-G1, and the first-third light emitting area PXA-R1 disposed in the first area A1.

Second mesh lines MSL-2 of the mesh lines MSL may include a second-first line M1 and a second-second line M2. The second-first line M1 may extend in the first diagonal direction CDR1, and the second-second line M2 may extend in the second diagonal direction CDR2.

The second mesh lines MSL-2 may be disposed in a portion of the second area A2. As an example, the second mesh lines MSL-2 may surround at least a portion of second-first light emitting area PXA-B2 and the second-third light emitting area PXA-R2.

A first light blocking portion BM1-A may not overlap the first area A1 and may surround the second-second light emitting areas PXA-G2 in the second area A2. In an embodiment, the first light blocking portion BM1-A may be provided integrally with the mesh lines MSL. Accordingly, the first light blocking portion BM1-A may include the substantially same material as that of the mesh lines MSL and may be provided integrally after patterning through the same process as the process by which the mesh lines MSL are formed.

A second light blocking portion BM2-A may be disposed on a layer different from a layer on which the first light blocking portion BM1-A and the mesh lines MSL are disposed. The second light blocking portion BM2-A may not overlap the first area A1 and may surround the second-first light emitting area PXA-B2 and the second-third light emitting area PXA-R2 of the second area A2.

A display device DD-1 may include a display panel 100, an input sensor 200-A, the light control layer 300-A, an anti-reflective layer 400, and a window 500 (refer to FIG. 2).

The input sensor 200-A may include a first sensing insulating layer IL1, a second sensing insulating layer IL2, and a third sensing insulating layer IL3. The first sensing insulating layer IL1 may be disposed on an encapsulation layer 140. The bridge patterns CP2 of the second sensing electrodes E2-1 to E2-4 described with reference to FIG. 5 may be disposed on the first sensing insulating layer IL1.

The second sensing insulating layer IL2 may be disposed on the first sensing insulating layer IL1. Among the first sensing electrodes E1-1 to E1-5 and the second sensing electrodes E2-1 to E2-4 described with reference to FIG. 5, the sensing patterns SP2 may be disposed on the second sensing insulating layer IL2. Sensing electrodes CL-A may correspond to one of the sensing patterns SP2 of the first sensing electrodes E1-1 to E1-5 and the second sensing electrodes E2-1 to E2-4. Accordingly, the mesh lines MSL described with reference to FIGS. 11 and 12 may form the sensing electrodes CL-A. The third sensing insulating layer IL3 may be disposed on the second sensing insulating layer IL2. According to an embodiment, the third sensing insulating layer IL3 may be omitted. In this case, a first cover layer OC1 may cover the second sensing insulating layer IL2.

The light control layer 300-A may include the first cover layer OC1, a second cover layer OC2, the first light blocking portion BM1-A, and the second light blocking portion BM2-A. The first cover layer OC1 may be disposed on the third sensing insulating layer IL3, and the second cover layer OC2 may be disposed on the first cover layer OC1.

The second light blocking portion BM2-A may include a second light blocking pattern B2-1A and a second additional light blocking pattern B2-2A. The second light blocking portion BM2-A may be disposed on the first cover layer OC1 and may be covered by the second cover layer OC2. The second light blocking portion BM2-A may correspond to the second light blocking portion BM2 described with reference to FIG. 9.

In an embodiment, the first light blocking portion BM1-A may include a first light blocking pattern B1-1A and a first additional light blocking pattern B1-2A. The first light blocking portion BM1-A and the sensing electrodes CL-A may be disposed on the second sensing insulating layer IL2 and may be covered by the third sensing insulating layer IL3.

In an embodiment, the first light blocking portion BM1-A may be provided integrally with the sensing electrodes CL-A. For example, the first light blocking portion BM1-A may include the substantially same material as that of the sensing electrodes CL-A and may be patterned through the same process as the process by which the sensing electrodes CL-A are formed. Accordingly, the first light blocking portion BM1-A may be connected to one of the sensing patterns SP2 of the first sensing electrodes E1-1 to E1-5 and the second sensing electrodes E2-1 to E2-4 described with reference to FIG. 5 and may serve as a sensing electrode. Accordingly, the first light blocking portion BM1-A may include a conductive material.

The first light blocking pattern B1-1A may overlap a second non-light-emitting area NCA-G, and the first additional light blocking pattern B1-2A may overlap a main non-light-emitting area NCA-M adjacent to the second non-light-emitting area NCA-G.

According to an embodiment, the first light blocking pattern B1-1A may have a first line width WD1. The first additional light blocking pattern B1-2A may have a second line width WD2 smaller than the first line width WD1, and the sensing electrodes CL-A may have a third line width WD3 smaller than the first line width WD1 and the second line width WD2.

In addition, the first light blocking pattern B1-1A and the first additional light blocking pattern B1-2A may have a width smaller than a width of an overlapping pixel definition layer. As an example, the first line width WD1 of the first light blocking pattern B1-1A may be smaller than the line width of an overlapping second pixel definition layer PDL2, and the second line width WD2 of the first additional light blocking pattern B1-2A may be smaller than the line width of an overlapping first pixel definition layer PDL1.

Even though the first light blocking portion BM1-A is disposed on the same layer as the layer on which the sensing electrodes CL-A are disposed, the first light blocking portion BM1-A may have a line width greater than that of the sensing electrodes CL-A. Accordingly, the light generated from the second element area AE2-G may be effectively blocked. In addition, since the first light blocking portion BM1-A is formed through the same process as the process, by which the sensing electrodes CL-A are formed, a process of forming a separate light blocking portion disposed adjacent to the second element area AE2-G may be omitted.

Figure 14:
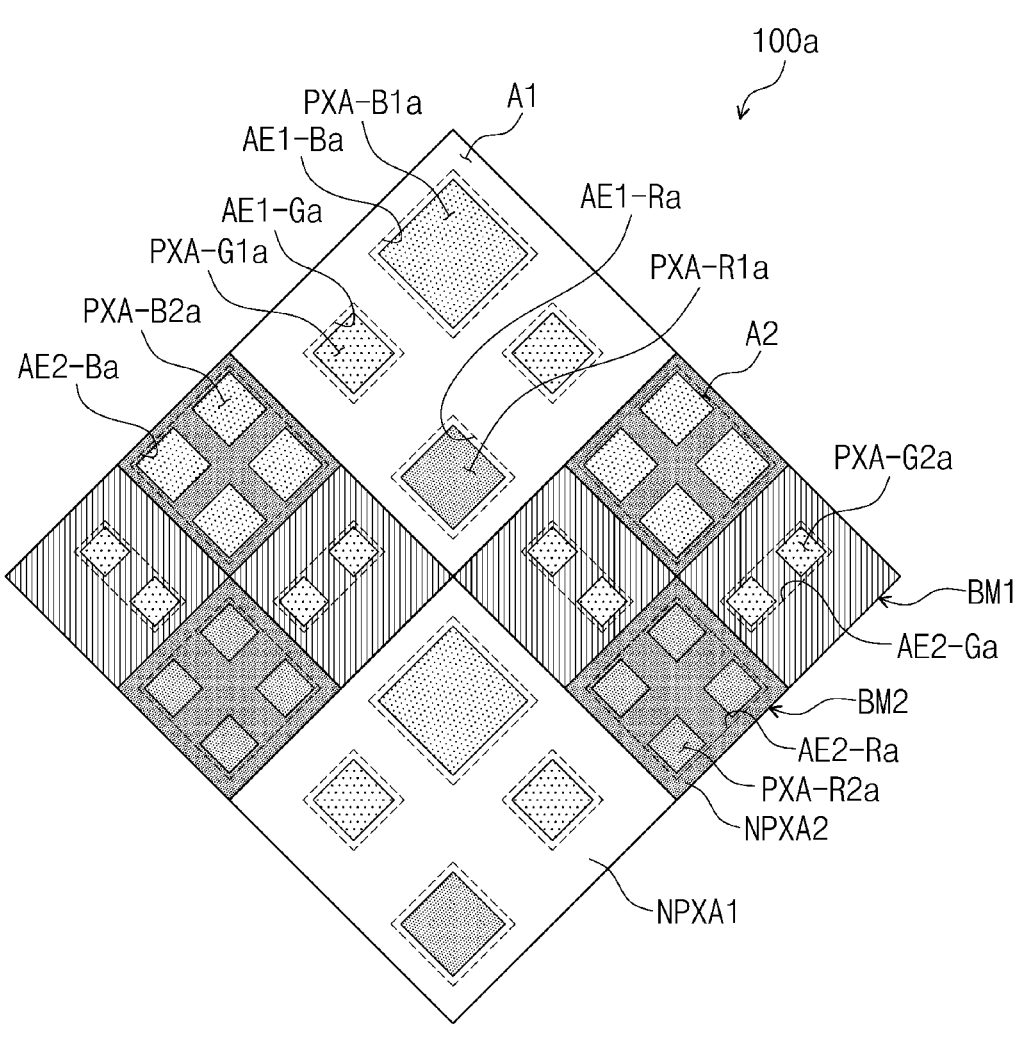
FIG. 14 is a plan view of another embodiment of the display panel of FIG. 3.
Figure 14:
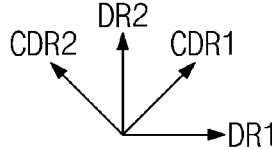
Figure 15:
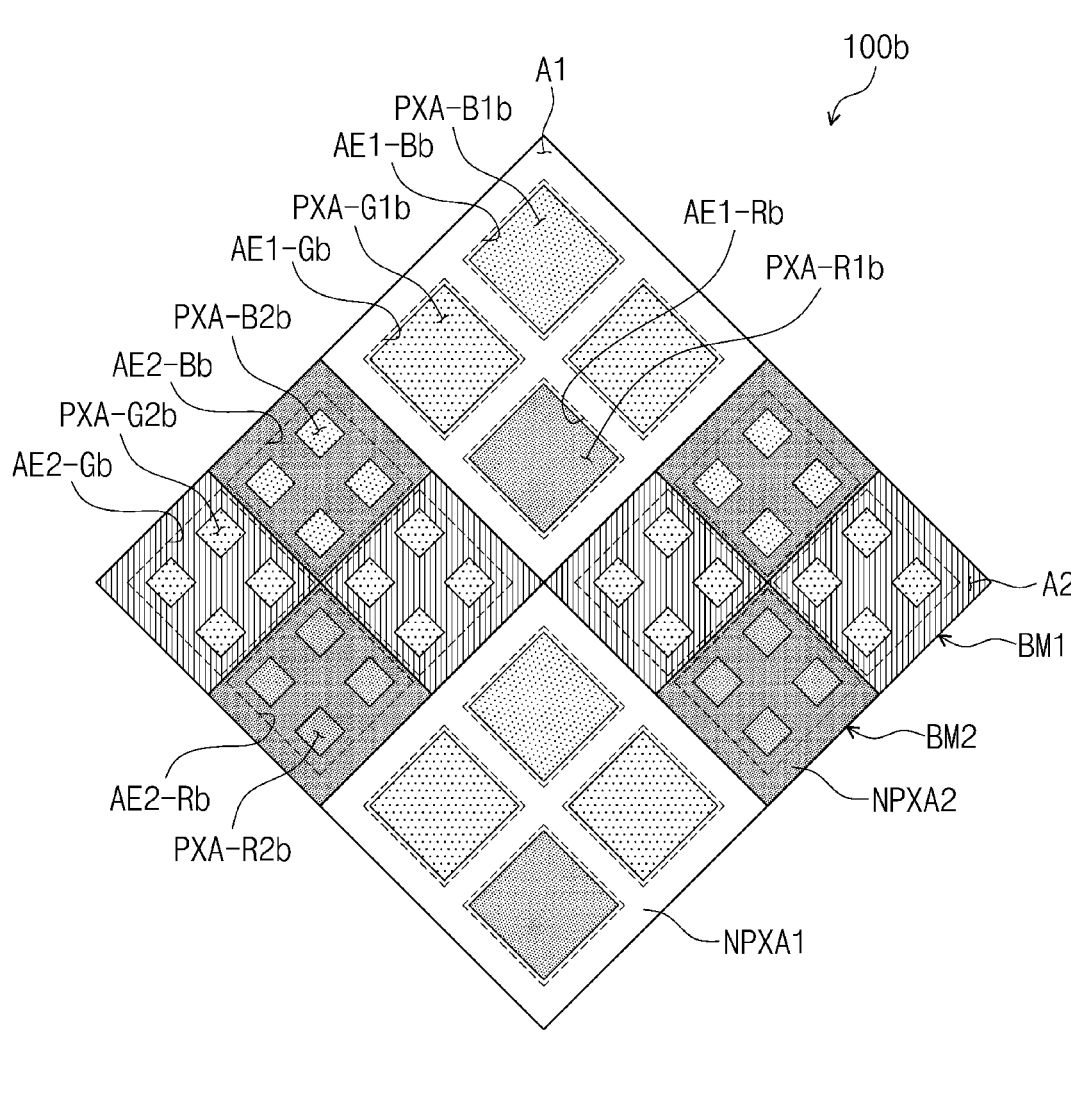
FIG. 15 is a plan view of another embodiment of the display panel of FIG. 3.
Figure 15:
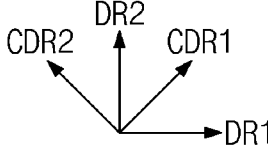
Figure 16:
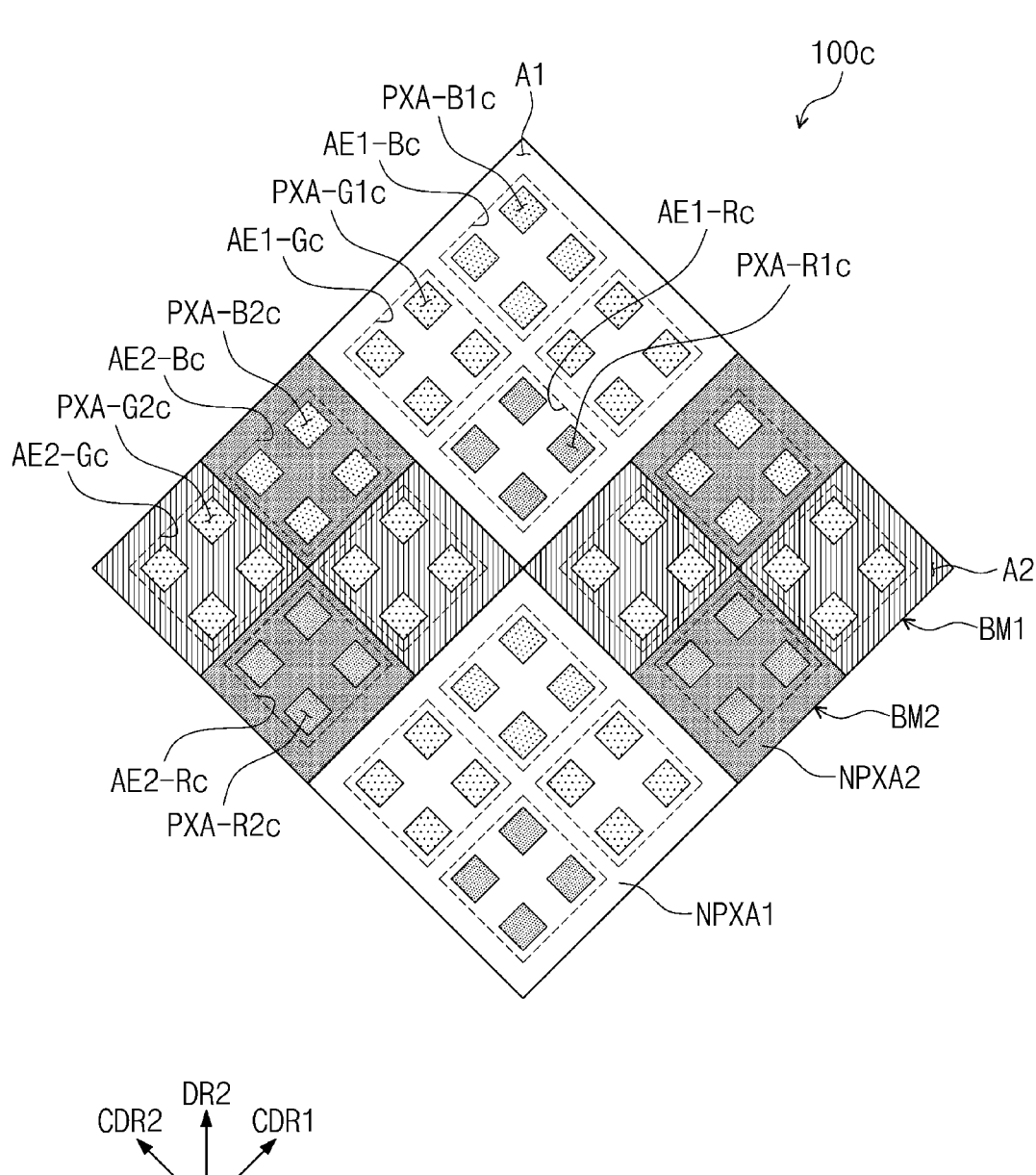
FIG. 16 is a plan view of another embodiment of the display panel of FIG. 3.

FIG. 14 is a plan view of a display panel 100a according to an embodiment. FIG. 15 is a plan view of a display panel 100b according to an embodiment. FIG. 16 is a plan view of a display panel 100c according to an embodiment. In FIGS. 14, 15, and 16, the same reference numerals denote the same elements in FIGS. 1 to 9, and thus, detailed descriptions of the same elements will be omitted for descriptive convenience.

FIGS. 14, 15, and 16 show embodiments of various shapes of element areas and light emitting areas of a first area A1 and a second area A2, and details with respect to first and second light blocking portions BM1 and BM2 are the same as those described above. The first and second light blocking portions BM1 and BM2 are illustrated by different hatchings.

Referring to FIG. 14, the display panel 100a may include the first area A1 and the second area A2. The first area A1 may include a first-first element area AE1-Ba, a first-second element area AE1-Ga, a first-third element area AE1-Ra, and a first peripheral area NPXA1. The second area A2 may include a second-first element area AE2-Ba, a second-second element area AE2-Ga, a second-third element area AE2-Ra, and a second peripheral area NPXA2.

The first area A1 may include a first-first light emitting area PXA-B1a, a first-second light emitting area PXA-G1a, and a first-third light emitting area PXA-R1a respectively corresponding to the first-first element area AE1-Ba, the first-second element area AE1-Ga, the first-third element area AE1-Ra.

The first-third light emitting area PXA-R1a may have a size smaller than a size of the first-first light emitting area PXA-B1a and may be greater than a size of the first-second light emitting area PXA-G1a.

In an embodiment, the second-first element area AE2-Ba may include four second-first light emitting areas PXA-B2a spaced apart from each other. The second-second element area AE2-Ga may include two second-second light emitting areas PXA-G2a spaced apart from each other. The second-third element area AE2-Ra may include four second-third light emitting areas PXA-R2a spaced apart from each other.

A size of each of the light emitting areas of the second area A2 may be determined by a size of the light emitting area for providing a light having the substantially same color in the first area A1. As an example, a size of one second-third light emitting area PXA-R2a may be smaller than a size of one second-first light emitting area PXA-B2a and may be greater than a size of one second-second light emitting area PXA-G2a.

According to an embodiment, a size of the first-first element area AE1-Ba generating a first color light may be smaller than a size of the second-first element area AE2-Ba. A size of the first-second element area AE1-Ga generating a second color light may be smaller than a size of the second-second element area AE2-Ga. A size of the first-third element area AE1-Ra generating a third color light may be smaller than a size of the second-third element area AE2-Ra.

FIG. 14 shows a structure in which the second-third element area AE2-Ra includes four second-third light emitting areas PXA-R2a, however, embodiments should not be particularly limited. The number of the second-third light emitting areas PXA-R2a included in the second-third element area AE2-Ra having an intermediate size may have an intermediate value of the number of the second-first light emitting area PXA-B2a and the second-second light emitting area PXA-G2a. For example, the second-third element area AE2-Ra may include three second-third light emitting areas PXA-R2a.

Referring to FIG. 15, the display panel 100b may include a first area A1 and a second area A2. The first area A1 may include a first-first element area AE1-Bb, a first-second element area AE1-Gb, a first-third element area AE1-Rb, and a first peripheral area NPXA1. The second area A2 may include a second-first element area AE2-Bb, a second-second element area AE2-Gb, a second-third element area AE2-Rb, and a second peripheral area NPXA2.

The first area A1 may include a first-first light emitting area PXA-B1b, a first-second light emitting area PXA-G1b, and a first-third light emitting area PXA-R1b respectively corresponding to the first-first element area AE1-Bb, the first-second element area AE1-Gb, and the first-third element area AE1-Rb.

In an embodiment, the first-first light emitting area PXA-B1b, the first-second light emitting area PXA-G1b, and the first-third light emitting area PXA-R1b may have the substantially same size as each other.

In an embodiment, the second-first element area AE2-Bb may include four second-first light emitting areas PXA-B2b spaced apart from each other. The second-second element area AE2-Gb may include four second-second light emitting areas PXA-G2*b* spaced apart from each other. The second-third element area AE2-Rb may include four second-third light emitting areas PXA-R2*b* spaced apart from each other.

The second-first light emitting area PXA-B2*b*, the second-second light emitting area PXA-G2*b*, and the second-third light emitting area PXA-R2*b* may have the substantially same size as each other.

In an embodiment, a size of the first-first element area AE1-Bb generating a first color light may be smaller than a size of the second-first element area AE2-Bb. A size of the first-second element area AE1-Gb generating a second color light may be smaller than a size of the second-second element area AE2-Gb. A size of the first-third element area AE1-Rb generating a third color light may be smaller than a size of the second-third element area AE2-Rb.

Referring to FIG. 16, the display panel 100*c* may include a first area A1 and a second area A2. The first area A1 may include a first-first element area AE1-Bc, a first-second element area AE1-Gc, a first-third element area AE1-Rc, and a first peripheral area NPXA1. The second area A2 may include a second-first element area AE2-Bc, a second-second element area AE2-Gc, a second-third element area AE2-Rc, and a second peripheral area NPXA2.

In an embodiment, the display panel 100*c* may further include an additional pixel defining layer disposed on the first electrodes AE (refer to FIG. 4A) exposed from the pixel defining layer PDL (refer to FIG. 4A) by the first openings OP1 (refer to FIG. 4A) in the first area A1. Accordingly, the first-first element area AE1-Bc, the first-second element area AE1-Gc, the first-third element area AE1-Rc may include a plurality of first-first light emitting areas PXA-B1*c*, a plurality of first-second light emitting areas PXA-G1*c*, and a plurality of first-third light emitting areas PXA-R1*c* divided by the additional pixel definition layer, respectively. For example, the first-first element area AE1-Bc may include four first-first light emitting areas PXA-B1*c* spaced apart from each other. The first-second element area AE1-Gc may include four first-second light emitting areas PXA-G1*c* spaced apart from each other. The first-third element area AE1-Rc may include four first-third light emitting areas PXA-R2*c* spaced apart from each other. The first-first element areas PXA-B1*c*, the first-second element areas PXA-G1*c*, and the first-third light emitting areas PXA-R1*c* may have the substantially same size as each other.

In an embodiment, the second-first element area AE2-Bc may include four second-first light emitting areas PXA-B2*c* spaced apart from each other. The second-second element area AE2-Gc may include four second-second light emitting areas PXA-G2*c* spaced apart from each other. The second-third element area AE2-Rc may include four second-third light emitting areas PXA-R2*c* spaced apart from each other. The second-first light emitting areas PXA-B2*c*, the second-second light emitting areas PXA-G2*c*, and the second-third light emitting areas PXA-R2*c* may have the substantially same size as each other.

In an embodiment, a size of the first-first element area AE1-Bc generating a first color light may be the substantially same as a size of the second-first element area AE2-Bc. A size of the first-second element area AE1-Gc generating a second color light may be the substantially same as a size of the second-second element area AE2-Gc. A size of the first-third element area AE1-Rc generating a third color light may be the substantially same as a size of the second-third element area AE2-Rc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel comprising a first area and a second area, the first area comprising a first-first element area for emitting a first color light, a first-second element area for emitting a second color light, a first-third element area for emitting a third color light, and a first peripheral area, the second area comprising a second-first element area for emitting the first color light, a second-second element area for emitting the second color light, a second-third element area for emitting the third color light, and a second peripheral area, the second-second element area having a size smaller than a size of the second-first element area and a size of the second-third element area;
a first light blocking pattern disposed on the display panel, the first light blocking pattern not overlapping the first area and overlapping the second-second element area of the second area; and a second light blocking pattern disposed on the display panel, the second light blocking pattern not overlapping the first area and overlapping the second-first element area and the second-third element area of the second area, wherein:

each of the second-first element area, the second-second element area, and the second-third element area of the second area comprises a plurality of light emitting areas and a non-light-emitting area disposed between the plurality of light emitting areas, the first light blocking pattern overlaps the non-light-emitting area of the second-second element area of the second area, and the second light blocking pattern overlaps the non-light-emitting area of the second-first element area of the second area and the non-light-emitting area of the second-third element area of the second area, and wherein the first light blocking pattern and the second light blocking pattern are disposed on different layers.

2. The display device of claim 1, wherein: the second light blocking pattern is disposed farther away from the display panel than the first light blocking pattern.

3. The display device of claim 1, wherein each of the plurality of light emitting areas in the second-third element area of the second area has a size smaller than a size of each of the plurality of light emitting areas in the second-first element area of the second area and greater than a size of each of the plurality of light emitting areas in the second-second element area of the second area.

4. The display device of claim 1, wherein the plurality of light emitting areas respectively in the second-first element area, the second-second element area, and the second-third element area of the second area have a same size as each other.

5. The display device of claim 1, wherein a number of the light emitting areas in the second-second element area of the second area is smaller than a number of the light emitting areas in the second-first element area of the second area or a number of the light emitting areas in the second-third element area of the second area.

6. The display device of claim 1, further comprising an anti-reflective layer disposed on the second light blocking pattern.

7. The display device of claim 1, further comprising a first additional light blocking pattern overlapping the second peripheral area adjacent to the second-second element area of the second area and provided integrally with the first light blocking pattern.

8. The display device of claim 1, further comprising a second additional light blocking pattern overlapping the second peripheral area disposed between the second-first element area and the second-third element area of the second area and provided integrally with the second light blocking pattern.

9. The display device of claim 1, further comprising:
an input sensor disposed on the display panel, the input sensor comprising
sensing electrodes overlapping the first peripheral area or the second peripheral area and at least one sensing insulating layer; and
a first cover layer disposed on an upper sensing insulating layer at an uppermost position of the at least one sensing insulating layer,
wherein the second light blocking pattern is disposed on the first cover layer.

10. The display device of claim 9, wherein the first light blocking pattern is disposed on the upper sensing insulating layer and is covered by the first cover layer.

11. The display device of claim 9, further comprising an additional cover layer disposed between the upper sensing insulating layer and the first cover layer to cover the sensing electrodes,
wherein the first light blocking pattern is in contact with the sensing electrodes and is covered by the additional cover layer.

12. The display device of claim 9, further comprising a second cover layer disposed on the first cover layer and covering the second light blocking pattern,
wherein the first cover layer and the second cover layer comprise an organic material.

13. The display device of claim 12, wherein the first cover layer has a thickness greater than a thickness of the second cover layer.

14. The display device of claim 1, further comprising an input sensor disposed on the display panel and comprising sensing electrodes overlapping the first peripheral area or the second peripheral area and at least one sensing insulating layer,
wherein the first light blocking pattern is provided integrally with the sensing electrodes.

15. The display device of claim 14, wherein the first light blocking pattern has a first line width greater than a line width of the sensing electrodes.

16. The display device of claim 15, wherein the sensing electrodes overlap the non-light-emitting area of each of the second-first element area and the second-third element area of the second area.

17. The display device of claim 16, wherein the sensing electrodes overlapping the second light blocking pattern and the non-light-emitting area of each of the second-first element area and the second-third element area among the sensing electrodes have a second line width smaller than the first line width.

18. The display device of claim 17, wherein the sensing electrodes overlapping the first area among the sensing electrodes have a third line width smaller than the second line width.

19. The display device of claim 1, wherein the display panel further comprises:
first light emitting elements disposed device of in each of the first-first element area of the first area and the second-first element area of the second area,
second light emitting elements disposed in each of the first-second element area of the first area and the second-second element area of the second area, and
third light emitting elements disposed in each of the first-third element area of the first area and the second-third element area of the second area, wherein the first light emitting elements, the second light emitting elements, and the third light emitting elements are for respectively providing lights having different colors, wherein each of the first light emitting elements, the second light emitting elements, and the third light emitting elements comprises a first electrode, a second electrode, and a light emitting layer disposed between the first electrode and the second electrode, and
wherein the display panel further comprises a first pixel definition layer having openings defined therethrough to expose at least a portion of the first electrode of each of the first light emitting elements, the second light emitting elements, and the third light emitting elements.

20. The display device of claim 19, wherein:
the display panel is to activate the first light emitting element, the second light emitting element, and the third light emitting element in the first area and
the first light emitting element, the second light emitting element, and the third light emitting element in the second area in a first operation mode, and
the display panel is to deactivate the first light emitting element, the second light emitting element, and the third light emitting element in the first area and to activate the first light emitting element, the second light emitting element, and the third light emitting element in the second area in a second operation mode.

21. The display device of claim 19, wherein the display panel further comprises a second pixel definition layer disposed on the first electrodes exposed through the openings of the first pixel definition layer and overlapping the non-light-emitting area of the second area.

22. The display device of claim 21, wherein the display panel further comprises an additional pixel definition layer disposed on the first electrodes exposed through the openings in the first area, and each of the first-first element area, the first-second element area, and the first-third element area in the first area comprises a plurality of light emitting areas separated from each other by the additional pixel definition layer.

23. The display device of claim 22, wherein a number of the plurality of light emitting areas of each of the second-first element area, the second-second element area, and the second-third element area of the second area is equal to a number of the plurality of light emitting areas of each of the first-first element area, the first-second element area, and the first-third element area of the first area.

24. A display device comprising:
a display panel operating in a first mode and a second mode and comprising a first area and a second area, the first area comprising a first-first light emitting area for emitting a first color light, a first-second light emitting area for emitting a second color light, a first-third light emitting area for emitting a third color light, a first-fourth light emitting area for emitting the second color light, and a first peripheral area, the second area comprising a plurality of second-first light emitting areas for emitting the first color light, a plurality of second-second light emitting areas for emitting the second color light, a plurality of second-third light emitting areas for emitting the third color light, a plurality of second-fourth light emitting areas for emitting the second color light, and a second peripheral area;

a first light blocking pattern disposed on the second peripheral area of the second area of the display panel, the first light blocking pattern surrounding and exposing the plurality of second-second light emitting areas and the plurality of second-fourth light emitting areas when viewed in plan; and a second light blocking pattern disposed on the second peripheral area of the second area of the display panel, the second light blocking pattern surrounding and exposing the plurality of second-first light emitting areas and the plurality of second-third light emitting areas of the second area when viewed in plan, wherein the first light blocking pattern and the second light blocking pattern are disposed on different layers.

25. The display device of claim 24, wherein:

the first mode is a wide viewing mode, and the second mode is a narrow viewing mode.

26. The display device of claim 24, wherein the second light blocking pattern is disposed at a higher level than the first light blocking pattern.

\* \* \* \* \*